United States Patent
Seo

(10) Patent No.: US 10,438,674 B2
(45) Date of Patent: Oct. 8, 2019

(54) MEMORY DEVICE AND METHOD OF OPERATING THE SAME

(71) Applicant: SK hynix Inc., Gyeonggi-do (KR)

(72) Inventor: Ji Hyun Seo, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 15/951,666

(22) Filed: Apr. 12, 2018

(65) Prior Publication Data

US 2018/0233207 A1  Aug. 16, 2018

Related U.S. Application Data

(63) Continuation of application No. 15/398,814, filed on Jan. 5, 2017, now Pat. No. 9,972,399.

(30) Foreign Application Priority Data

Jul. 28, 2016  (KR) ........................ 10-2016-0096292

(51) Int. Cl.
| | | |
|---|---|---|
| *G11C 16/34* | (2006.01) | |
| *G11C 16/04* | (2006.01) | |
| *G11C 16/10* | (2006.01) | |
| *G11C 16/30* | (2006.01) | |
| *H01L 27/11568* | (2017.01) | |
| *H01L 27/11573* | (2017.01) | |
| *H01L 27/11582* | (2017.01) | |
| *G11C 16/08* | (2006.01) | |

(52) U.S. Cl.
CPC ...... *G11C 16/3459* (2013.01); *G11C 16/0466* (2013.01); *G11C 16/0483* (2013.01); *G11C 16/08* (2013.01); *G11C 16/10* (2013.01); *G11C 16/30* (2013.01); *H01L 27/11568* (2013.01); *H01L 27/11573* (2013.01); *H01L 27/11582* (2013.01)

(58) Field of Classification Search
CPC ........................ G11C 16/3459; G11C 16/0483
See application file for complete search history.

(56) References Cited

U.S. PATENT DOCUMENTS

| | | | | |
|---|---|---|---|---|
| 9,165,669 B2* | 10/2015 | Nam | ....................... | G11C 16/16 |
| 9,373,403 B1* | 6/2016 | Chen | ....................... | G11C 16/10 |
| 9,747,995 B2* | 8/2017 | Shim | ................... | G11C 16/0483 |
| 2009/0073763 A1* | 3/2009 | Hosono | ............... | G11C 11/5642 365/185.03 |
| 2012/0254680 A1* | 10/2012 | Oh | ....................... | G06F 11/1068 714/723 |
| 2013/0242667 A1* | 9/2013 | Shim | ................... | G11C 16/0483 365/185.19 |
| 2017/0330632 A1* | 11/2017 | Shim | ................... | G11C 16/0483 |

* cited by examiner

*Primary Examiner* — Hoai V Ho
*Assistant Examiner* — Jay W. Radke
(74) *Attorney, Agent, or Firm* — IP & T Group LLP

(57) ABSTRACT

Provided herein are a memory device and a method of operating the memory device. The memory device comprises a plurality of memory cells stacked along a pillar vertical to a substrate, a peripheral circuit configured to program and verifying memory cells coupled to a selected word line, among the memory cells, and a control logic configured to control the peripheral circuit so that a pass voltage applied to unselected word lines is adjusted depending on a location of the selected word line when the memory cells are verified.

13 Claims, 18 Drawing Sheets

MEMORY DEVICE AND METHOD OF OPERATING THE SAME

CROSS-REFERENCE TO RELATED APPLICATION

This application is a continuation of U.S. patent application Ser. No. 15/398,814 filed on Jan. 5, 2017, which claims priority under 35 U.S.C. § 119(a) to Korean patent application number 10-2016-0096292, filed on Jul. 28, 2016, the entire disclosure of which is incorporated herein by reference in its entirety.

BACKGROUND

Field of Invention

Various embodiments of the present disclosure relate to a memory device and a method thereof, and more particularly, to a three-dimensional (3D) memory device and a method of operating the memory device.

Description of Related Art

Memory devices may be chiefly classified into volatile memory devices and nonvolatile memory devices.

A nonvolatile memory device has relatively low write and read speeds compared to a volatile memory device, but may maintain data stored therein even when the power supply to the device is interrupted. Therefore, in order to store data to be maintained regardless of whether or not power is supplied, a nonvolatile memory device is widely used in portable electronic devices. A nonvolatile memory device may be or include a Read Only Memory (ROM), a Mask ROM (MROM), a Programmable ROM (PROM), an Erasable Programmable ROM (EPROM), an Electrically Erasable Programmable ROM (EEPROM), a flash memory, a Phase change Random Access Memory (PRAM), a Magnetic RAM (MRAM), a Resistive RAM (RRAM), a Ferroelectric RAM (FRAM), and the like depending on the scheme for storing data.

A memory device such as a flash memory may be formed either in a two-dimensional (2D) structure in which cell strings are arranged horizontally on a semiconductor substrate or in a three-dimensional (3D) structure in which cell strings are arranged vertically on a semiconductor substrate. 3D memory devices were designed for overcoming a limitation in the degree of integration of the 2D memory device, and may include a plurality of memory cells stacked vertically on a semiconductor substrate.

SUMMARY

Various embodiments of the present disclosure are directed to a memory device and a method of operating the memory device, which may improve the reliability of a program operation of a 3D memory device.

One embodiment of the present disclosure provides a memory device comprising: a plurality of memory cells stacked along a pillar vertical to a substrate; a peripheral circuit configured to program and verifying memory cells coupled to a selected word line, among the memory cells; and a control logic configured to control the peripheral circuit so that a pass voltage applied to unselected word lines is adjusted depending on a location of the selected word line when the memory cells are verified.

The present disclosure provides a method of operating a memory device, the method comprising: setting a pillar region having a width smaller than a reference width; determining whether a selected word line is included in the pillar region during a program operation; When it is determined that the selected word line is not included in the pillar region, setting a first pass voltage, whereas when it is determined that the selected word line is included in the pillar region, setting the first pass voltage and a second pass voltage higher than the first pass voltage; programming memory cells coupled to the selected word line; and verifying the memory cells by applying a verification voltage to the selected word line and applying either the first pass voltage or the first and second pass voltages to unselected word lines.

Further, the present disclosure provides a method of operating a memory device, the method comprising: defining a plurality of pillar regions depending on a width of the pillar, wherein a plurality of memory cells are stacked along the pillar; setting one or more pass voltages depending on a pillar region in which a selected word line is included, among the pillar regions; programming memory cells coupled to the selected word line by applying a program voltage to the selected word line; and verifying the memory cells by applying a verification voltage to the selected word line and selectively applying the pass voltages to unselected word lines.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

Figure 1:
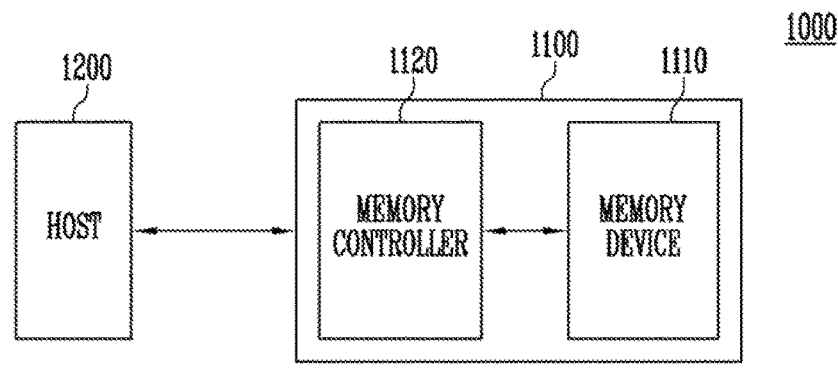
FIG. 1 is a diagram illustrating a memory system, according to an embodiment of the present disclosure.

Hereinafter, embodiments will be described in greater detail with reference to the accompanying drawings. Embodiments are described herein with reference to cross-sectional illustrations that are schematic illustrations of embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but may include deviations in shapes that result, for example, from manufacturing. In the drawings, lengths and sizes of layers and regions may be exaggerated for clarity. Like reference numerals in the drawings denote like elements.

Terms such as 'first' and 'second' may be used to describe various components, but they should not limit the various components. Those terms are only used for the purpose of differentiating a component from other components. For example, a first component may be referred to as a second component, and a second component may be referred to as a first component and so forth without departing from the spirit and scope of the present disclosure. Furthermore, 'and/or' may include any one of or a combination of the components mentioned.

Furthermore, a singular form may include a plural from as long as it is not specifically mentioned in a sentence. Furthermore, "include/comprise" or "including/comprising" used in the specification represents that one or more components, steps, operations, and elements exist or are added.

Furthermore, unless defined otherwise, all the terms used in this specification including technical and scientific terms have the same meanings as would be generally understood by those skilled in the related art. The terms defined in generally used dictionaries should be construed as having the same meanings as would be construed in the context of the related art, and unless clearly defined otherwise in this specification, should not be construed as having idealistic or overly formal meanings.

It is also noted that in this specification, "connected/coupled" refers to one component not only directly coupling another component but also indirectly coupling another component through an intermediate component. On the other hand, "directly connected/directly coupled" refers to one component directly coupling another component without an intermediate component.

Spatially relative terms, such as "under," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in manufacturing, use or operation in addition to the orientation depicted in the figures. For example, if the device in the figures is turned over, elements described as "below" or "under" other elements or features would then be "above" the other elements or features. The device may be otherwise oriented (rotated 90 degrees or at other orientations) and the spatially relative descriptors used herein interpreted accordingly.

FIG. 1 is a diagram illustrating a memory system 1000, according to an embodiment of the present disclosure.

Referring to FIG. 1, the memory system 1000 may include a storage device 1100 operatively coupled to a host 1200. The host 1200 may control the storage device 1100. The storage device 1100 may include a memory device 1110 for storing data and a memory controller 1120 operatively coupled to the memory device 1100 for controlling the memory device 1110.

The host 1200 may communicate with the storage device 1100 using an interface protocol, such as a Peripheral Component Interconnect-Express (PCI-E), an Advanced Technology Attachment (ATA), a Serial ATA (SATA), a Parallel ATA (PATA), a Serial Attached SCSI (SAS) a Universal Serial Bus (USB), a Multi-Media Card (MMC), an Enhanced Small Disk Interface (ESDI), an Integrated Drive Electronics (IDE) and the like.

The memory controller 1120 controls an operation of the storage device 1100, and controls data exchange between the host 1200 and the memory device 1110. For example, the memory controller 1120 may control the memory device 1110 so that a program, read or erase operation is performed in response to a request received from the host 1200.

The memory device 1110 may include a Double Data Rate Synchronous Dynamic Random Access Memory (DDR SDRAM), a Low Power Double Data Rate4 (LPDDR4) SDRAM, a Graphics Double Data Rate (GDDR) SDRAM, a Low Power DDR (LPDDR) SDRAM, a Rambus Dynamic Random Access Memory (RDRAM) or a flash memory. In the present embodiment, the memory device 1110 implemented as a flash memory will be described by way of example.

Figure 2:
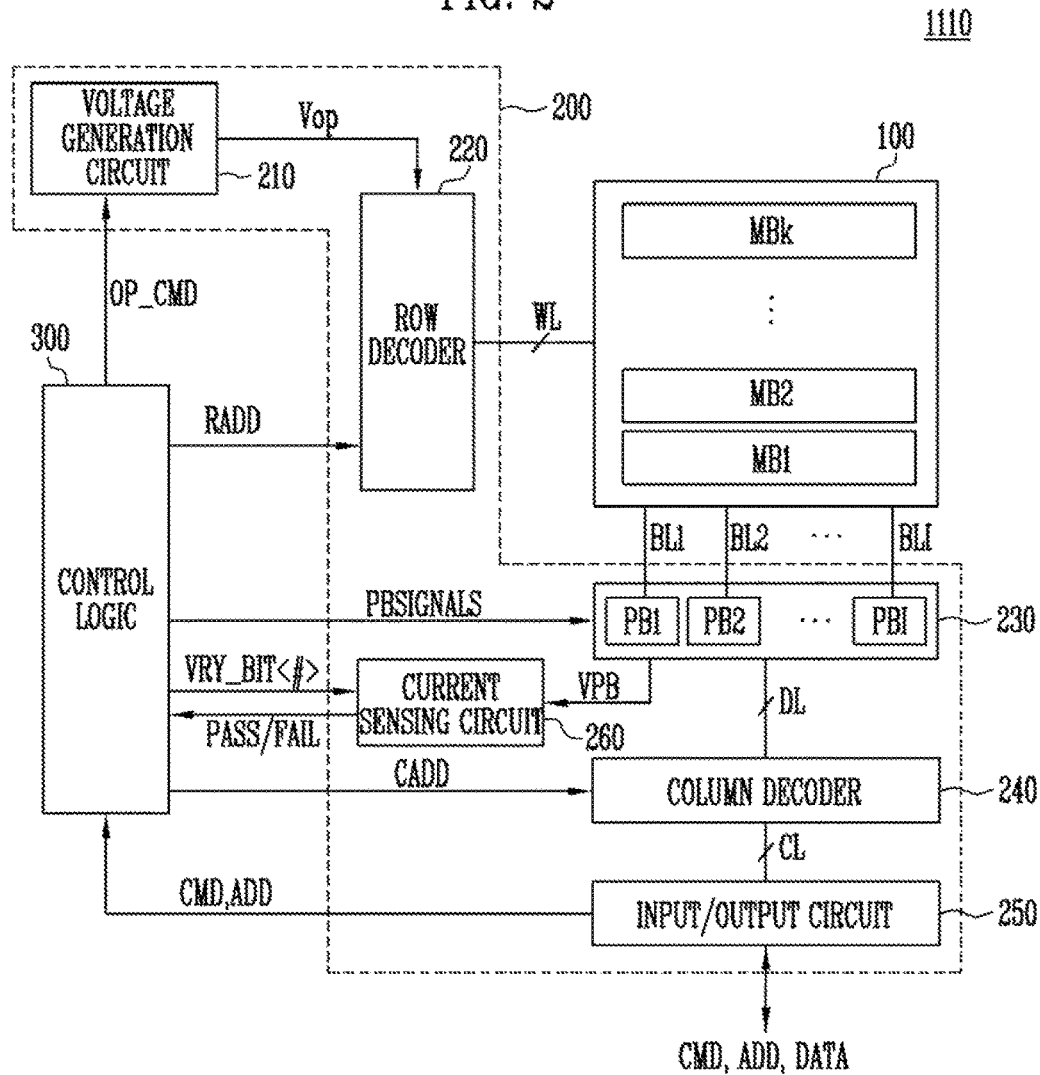
FIG. 2 is a diagram illustrating the memory device of FIG. 1.

FIG. 2 is a diagram illustrating the memory device 1110 of FIG. 1.

Referring to FIG. 2, the memory device 1110 may include a memory cell array 100 for storing data. The memory device 1110 may include a peripheral circuit 200 configured to perform a program operation for storing data in the memory cell array 100, a read operation for outputting the stored data from the memory cell array 100, and an erase operation for erasing the stored data in the memory cell array 100. The memory device 1110 may include a control logic 300 for controlling the peripheral circuit 200 under the control of the memory controller 1120 (shown in FIG. 1).

The memory cell array 100 may include a plurality of memory blocks MB1 to MBk, k being a positive integer. Respective memory blocks MB1 to MBk may be coupled to word lines WL and bit lines BL1 to BLI, I being a positive integer. The word lines WL may be coupled to respective memory blocks, and the bit lines BL1 to BLI may be coupled in common to the memory blocks MB1 to MBk. The memory blocks MB1 to MBk may be implemented in a 2D or 3D structure. When the memory blocks MB1 to MBk are implemented in the 3D structure, source select lines, drain select lines, and a source line, in addition to the word lines WL, may be coupled to each of the memory blocks MB1 to MBk, and pipelines may be additionally coupled thereto.

The peripheral circuit 200 may be configured to program, read, and erase data to/from memory cells included in a selected page under the control of the control logic 300. The program operation may include a program voltage apply operation for applying a program voltage to a selected word line coupled to the selected page, and a program verify operation for determining whether threshold voltages of memory cells coupled to the selected word line have reached target levels. The program voltage apply operation and the program verify operation constitute a single loop, and a plurality of loops may be repeated during the program operation. The program operation may be performed in an Incremental Step Pulse Program (ISPP) manner in which a program voltage is increased step by step whenever each loop is executed.

The program verify operation may be performed in a way similar to that of the read operation. For example, during the program verify operation, when a verification voltage is applied to a selected word line, a pass voltage is applied to unselected word lines. Likewise, during the read operation, when a read voltage is applied to the selected word line, a pass voltage is applied to unselected word lines. Hereinafter, the pass voltage during the program operation is referred to as a "program pass voltage", and the pass voltage during the read operation is referred to as a "read pass voltage".

In an embodiment, the program pass voltage may be adjusted in consideration of the widths of the pillars of 3D cell strings or the sequence of the program operation. For example, when memory cells included in a region in which the width of a pillar is greater than or equal to a reference width, are verified, program pass voltages identical to the read pass voltage may be used. However, when memory cells included in a region in which the width of a pillar is less than the reference width, are verified, both a first pass voltage equal to the read pass voltage and a second pass voltage greater than the read pass voltage may be used as program pass voltages. For example, the second pass voltage having a relatively greater level may be applied to word lines adjacent to the selected word line, among unselected word lines. Here, the first program voltage having a relatively low level may be applied to the remaining unselected word lines and the verification voltage may be applied to the selected word line.

The peripheral circuit 200 may include a voltage generation circuit 210, a row decoder 220, a page buffer unit 230, a column decoder 240, an input/output (I/O) circuit 250, and a current sensing circuit 260.

Individual circuits are described in detail below.

The voltage generation circuit 210 may generate a plurality of operating voltages Vop used for program, read, and erase operations in response to an operation signal OP_CMD. For example, the voltage generation circuit 210 may generate a program voltage, a verification voltage, a pass voltage including the program pass voltage and the read pass voltage, a read voltage, an erase voltage, a turn-on voltage, etc.

The row decoder 220 may apply the operating voltages Vop to word lines WL coupled to a selected memory block in response to a row address RADD. Although not shown in FIG. 2, the row decoder 220 may decode the row address RADD and apply the operating voltages Vop to the word lines WL, and may apply the operating voltages Vop to source select lines, drain select lines, a source line, and pipelines, in addition to the word lines WL.

The page buffer unit 230 may include a plurality of page buffers PB1 to PBI coupled to the bit lines BL1 to BLI, respectively. The page buffers PB1 to PBI may operate in response to page buffer control signals PBSIGNALS. For example, the page buffers PB1 to PBI may temporarily store data received through the bit lines BL1 to BLI or may sense voltages or currents on the bit lines BL1 to BLI during a read or program verify operation.

The column decoder 240 may transfer data between the I/O circuit 250 and the page buffer unit 230 in response to a column address CADD. For example, the column decoder 240 may decode the column address CADD and exchange data with page buffers PB through data lines DL and may exchange data with the I/O circuit 250 through column lines CL.

The I/O circuit 250 may transfer a command CMD and an address ADD from the memory controller 1120 (see FIG. 1) to the control logic 300, or may exchange data DATA with the column decoder 240.

The current sensing circuit 260 may generate a reference current in response to a permission bit VRY_BIT<#> during a read operation or a program verify operation, may compare a sensing voltage VPB received from the page buffer unit 230, with a reference voltage generated based on the reference current, and may then output a pass or fail signal PASS/FAIL to the control logic 300.

The control logic 300 may control the peripheral circuit 200 by generating the operation signal OP_CMD, the row address RADD, the page buffer control signals PBSIGNALS, and the permission bit VRY_BIT<#> in response to the command CMD and the address ADD. Further, the control logic 300 may determine whether a program verify operation has passed or failed in response to the pass or fail signal PASS/FAIL. In particular, during a program verify operation, the control logic 300 may output the operation signal OP_CMD required to adjust the program pass voltage depending on the location of a selected word line.

Figure 3:
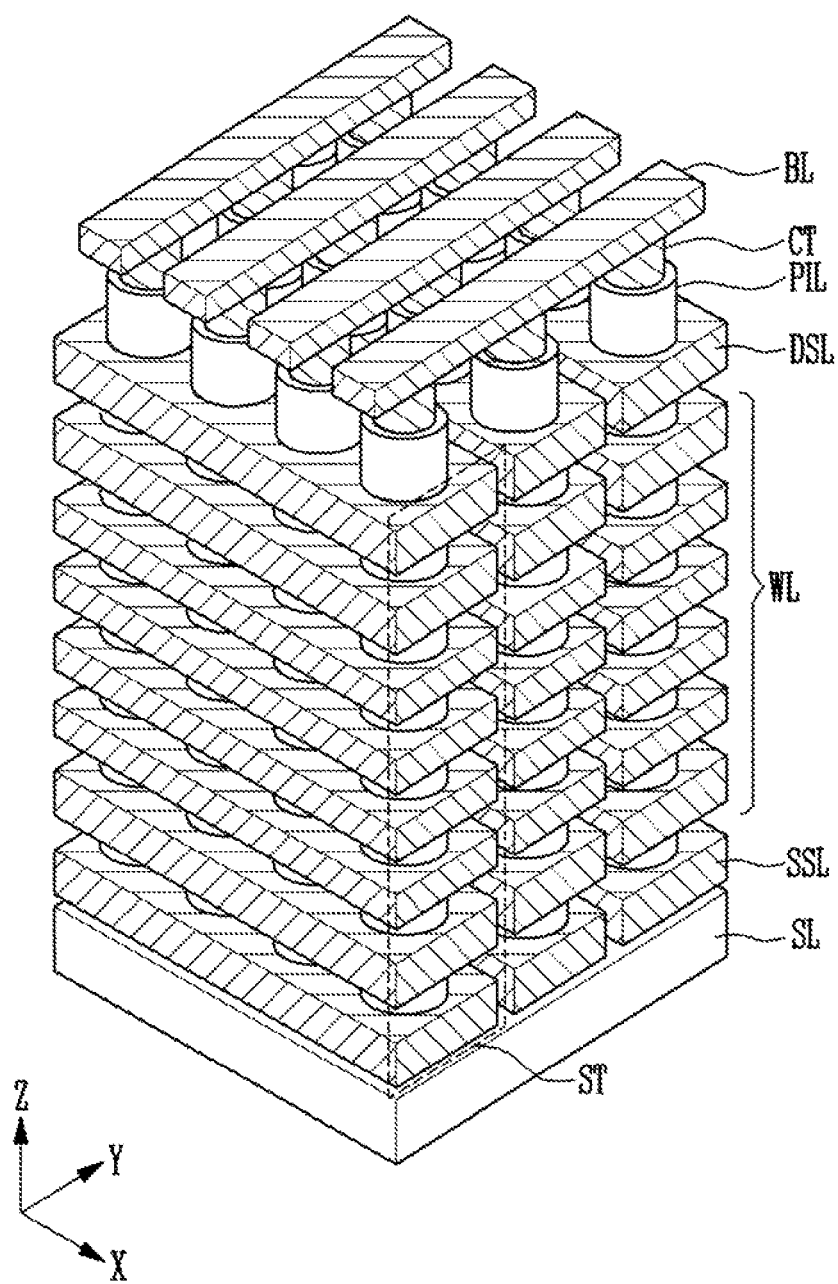
FIG. 3 is a perspective view illustrating an embodiment of a memory block configured in a 3D structure.

FIG. 3 is a perspective view illustrating an embodiment of a memory block configured in a 3D structure.

Referring to FIG. 3, the memory block implemented in a 3D structure may be include cell strings ST, which are formed in an "I"-shape vertical to a substrate (not shown), i.e., in a Z direction, and arranged between bit lines BL and a source line SL. Such a structure is also referred to as a "Bit Cost Scalable (BiCS) structure". For example, when the source line SL is formed horizontally on the top of the substrate, cell strings ST having a BiCS structure may be formed vertically on the top of the source line SL. More specifically, the cell strings ST may include source select lines SSL, word lines WL, and drain select lines DSL, which are arranged in a first direction, i.e., a Y direction, and which are sequentially stacked in the Z direction while being spaced apart from each other. The numbers of source select lines SSL, word lines WL, and drain select lines DSL are not limited to the numbers shown in FIG. 3, and may differ according to the type of memory device.

The cell strings ST may include a pillar PIL and the bit lines BL. The pillar PIL may vertically penetrate through the source select lines SSL, the word lines WL, and the drain select lines DSL. The bit lines BL may be adjacent to the top of the pillar PIL protruding upwards from the tops of the drain select lines DSL, and arranged in a second direction, i.e., an X direction, orthogonal to the first direction, i.e., the Y direction.

The pillar PIL may include a vertical channel layer and a memory layer (not shown). For example, the memory layer may be formed in a cylindrical shape along the inner circumferential surfaces of vertical holes vertically formed through the source select lines SSL, the word lines WL, and the drain select lines DSL, and the vertical channel layer may be formed inside the memory layer. When the vertical channel layer is formed in a cylindrical shape, the inside of the vertical channel layer may be filled with a vertical insulating layer. The vertical channel layer may be formed of a polysilicon layer. The memory layer may be formed in the shape of a cylinder that encloses the vertical channel layer, and may include a tunnel insulating layer, a charge trap layer, and a blocking layer. In the memory layer, portions being in contact with the word lines WL may be the memory cells.

Contact plugs CT may be further formed between the bit lines BL and the pillar PIL. Memory cells coupled to the same word line are referred to as a 'page'. Here, the page denotes a physical structure, and each of individual physical pages may include a plurality of logical pages.

A program operation may be performed on a page basis, and a partial erase operation may be performed on one or more pages. The read operation may be performed on a page basis.

Figure 4:
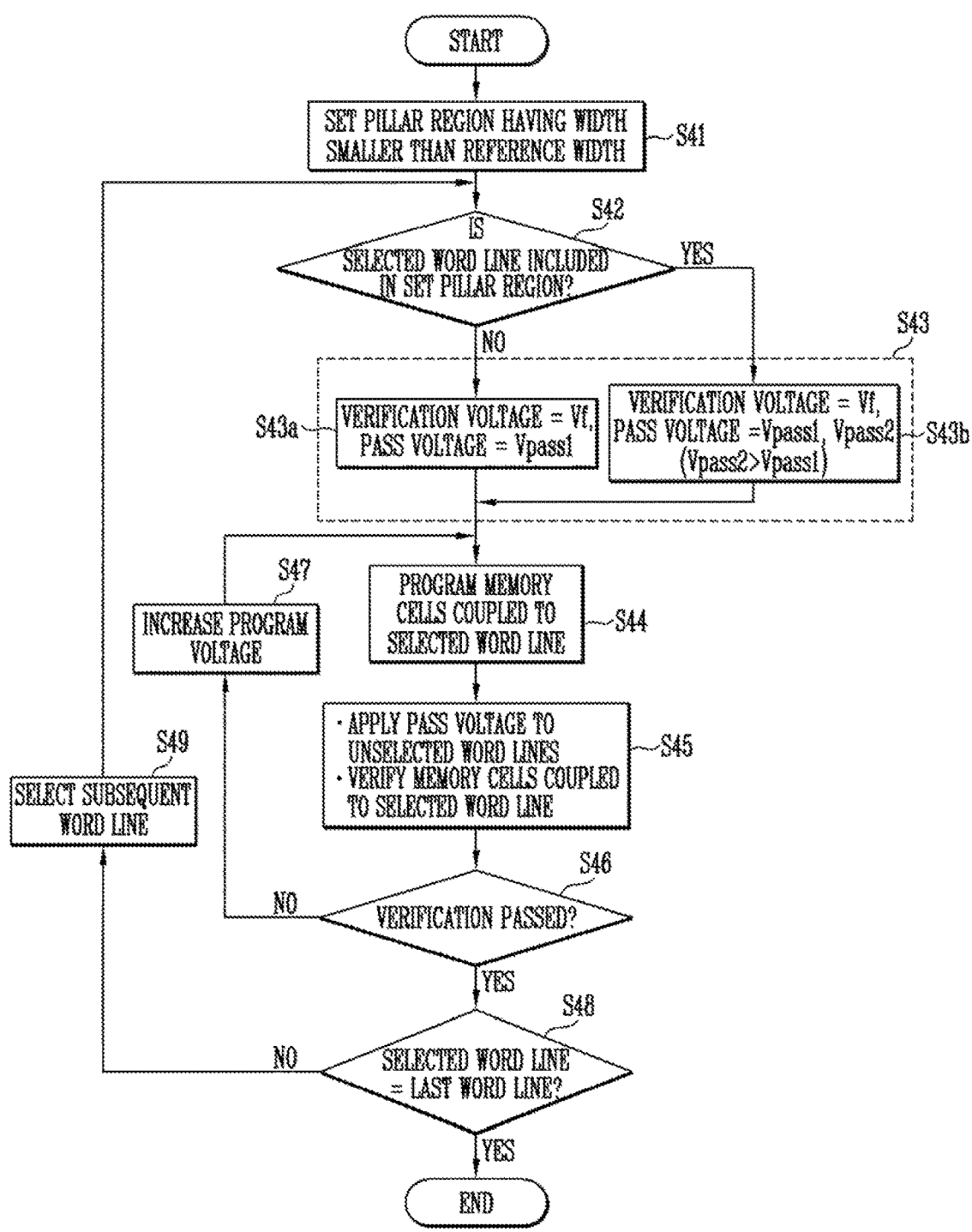
FIG. 4 is a flowchart illustrating a program operation according to an embodiment of the present disclosure.

FIG. 4 is a flowchart illustrating a program operation according to an embodiment of the present disclosure.

Referring to FIG. 4, the program operation may include the step of setting a program pass voltage depending on the location of a selected word line, the step of applying a program voltage to the selected word line, and the step of verifying memory cells coupled to the selected word line using the set program pass voltage. The program operation including the above steps will be described in detail below.

Before the program operation is performed, each cell string may be divided into a plurality of pillar regions depending on the width of the pillar. Information on individual pillar regions may be stored in the control logic 300 (see FIG. 2). For example, when a single reference width is set, a pillar region having a width smaller than the reference width may be set at step S41. Alternatively, when a plurality of reference widths are set, a plurality of pillar regions may be set depending on the reference widths. In the embodiment of FIG. 4, for the convenience of description, the case where a single reference width is set will be described by way of example.

When a command for a program operation, an address, and data are received by the memory device 1110 (see FIG. 2) from the memory controller 1120 (see FIG. 1), the control logic 300 of the memory device 1110 determines whether a word line selected from a row address included in the received address is included in the set pillar region at step S42. For example, when a pillar region, the width of which is smaller than the reference width, is set, the control logic 300 may determine whether the selected word line is included in the set pillar region. Due to the characteristics of a process for manufacturing a 3D memory device, the pillar is formed so that the width thereof becomes smaller in a direction from the top to the bottom. The pillar region having a width smaller than the reference width is mainly set in a lower portion of the cell string.

When it is determined whether the selected word line is included in the set pillar region, a verification voltage Vf and a program pass voltage may be set at step S43. Here, in case where the verification voltage Vf may be set in advance in the control logic 300 at step S43, only the program pass voltage may be set. When it is determined that the selected word line is not included in the set pillar region (in case of "No"), a first pass voltage Vpass1 may be set at step S43a. When it is determined that the selected word line is included in the set pillar region (in case of "Yes"), the first pass voltage Vpass1 and a second pass voltage Vpass2 may be set at step S43b. The second pass voltage Vpass2 may be set to a voltage that is higher than the first pass voltage Vpass1 and is lower than a program voltage.

After the program pass voltage is set at step S43, memory cells coupled to the selected word line are programmed at step S44. For example, the program voltage is applied to the selected word line, and thus the threshold voltages of the memory cells are increased.

After the program voltage is applied for a predetermined period of time, a program verify operation for verifying the memory cells coupled to the selected word line is performed at step S45. During the program verify operation, the verification voltage Vf is applied to the selected word line, and the first pass voltage Vpass1 or the first and second pass voltages Vpass1 and Vpass2, set at step S43, may be applied to the unselected word lines. Of the first and second pass voltages Vpass1 and Vpass2, the second pass voltage Vpass2 may be applied to unselected word lines adjacent to the selected word line. For example, the second pass voltage Vpass2 may be applied to an unselected word line adjacent to the selected word line in an upward direction, i.e., an unselected word line adjacent to the top of the selected word line, and may also be applied to unselected word lines adjacent to the selected word line in upward and downward directions, i.e., unselected word lines adjacent to the top and bottom of the selected word line. When the second pass voltage Vpass2 is applied to the unselected word lines adjacent to the selected word line, the first pass voltage Vpass1 may be applied to the remaining unselected word lines.

It is determined whether the program verify operation has passed or failed at step S46. When the program verify operation has failed (in case of "No"), the program voltage is increased at step S47, and steps S44, S45, S46, and S47 are repeated until the threshold voltages of the selected memory cells are increased up to target voltages. When the program verify operation has passed (in case of "Yes"), it is determined whether the selected word line is a last word line at step S48. That is, whether, among program target pages in the selected memory block, a selected page is a last page is determined.

When it is determined that the selected word line is the last word line (in case of "Yes"), the program operation is terminated. When it is determined that the selected word line is not the last word line (in case of "No"), a subsequent word line is selected at step S49, and steps S42 to S49 are repeated until all of the program target pages are programmed.

As described above, when a program verify operation is performed on the memory cells included in a region in which the width of the pillar is smaller than those of other regions, the program pass voltage applied to unselected word lines adjacent to the selected word line is increased. Accordingly, electrons may be slowly trapped in selected memory cells, and thus a large number of electrons may be finally trapped in the selected memory cells while a program loop is repeatedly performed. Accordingly, the reliability of the program operation and the retention characteristics of memory cells may be improved.

A method by which the above-described program operation is applied to a 3D memory device will be described below by means of various embodiments.

Figure 5:
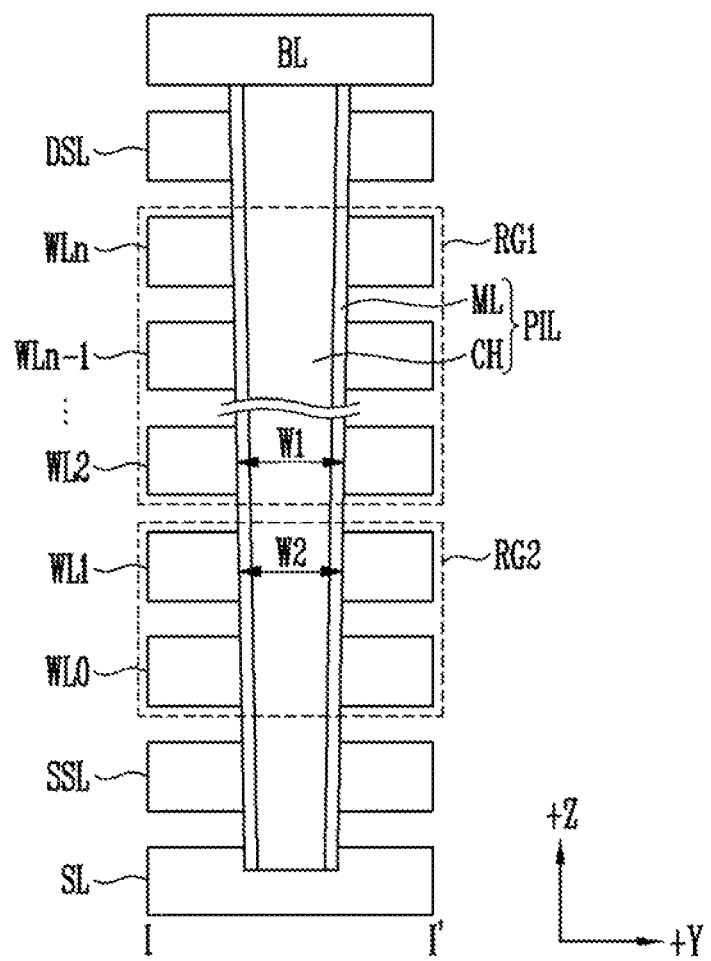
FIG. 5 is a sectional view illustrating a cell string formed in a single-stack structure.

FIG. 5 is a sectional view illustrating a cell string formed in a single-stack structure, and shows a cross section of the cell string ST having a BiCS structure, shown in FIG. 3.

Referring to FIG. 5, the single-stack structure denotes a single layered structure in which a pillar PIL is formed in stacked word lines. The pillar PIL may include a memory layer ML and a vertical channel layer CH. In this structure, the result of a program verify operation may differ depending on current flowing through the vertical channel layer CH, and thus the width of the pillar PIL may influence the reliability of a memory device. However, depending on the characteristics of a process for manufacturing the memory device, the pillar PIL is formed so that the width thereof becomes gradually smaller in a direction from the top to the bottom. Thus, in the present embodiment, when memory cells present in a region in which the width of the pillar PIL is smaller than a reference width are verified, a program pass voltage that is applied to the unselected word lines is increased.

More specifically, the width of a region in which the reliability of the program verify operation is deteriorated through a test operation may be set to a reference width W1. For example, it is assumed that, when 0th to nth word lines WL0 to WLn (n is a positive integer) are sequentially stacked on the top of a source select line SSL, the second word line WL2 is located in the region corresponding to the reference width W1. In this case, the width W2 of the pillar of the first word line WL1 located below the second word line WL2 may be formed to be smaller than the reference width W1. A region in which the second to nth word lines WL2 to WLn are located may be a first pillar region RG1, and a region in which the 0th and first word lines WL0 and WL1 are located may be a second pillar region RG2.

During a program verify operation, when the selected word line is included in the first pillar region RG1, the first pass voltage Vpass1 may be used. On the contrary, when the selected word line is included in the second pillar region RG2 having a relatively smaller width than the first pillar region, both the first pass voltage Vpass1 and the second pass voltage Vpass2 which has a value higher than the first pass voltage Vpass1 may be used. For example, when only the first pass voltage Vpass1 is used, the first pass voltage Vpass1 is applied to all unselected word lines. When both the first and second pass voltages Vpass1 and Vpass2 are used, the second pass voltage Vpass2 may be applied to unselected word lines adjacent to the selected word line, and the first pass voltage Vpass1 may be applied to the remaining unselected word lines. When the first and second pass voltages Vpass1 and Vpass2 are selectively applied to the unselected word lines, the verification voltage is applied to the selected word line, and thus selected memory cells are verified.

The program verify operation of the above-described cell string will be described in detail below.

Figure 6:
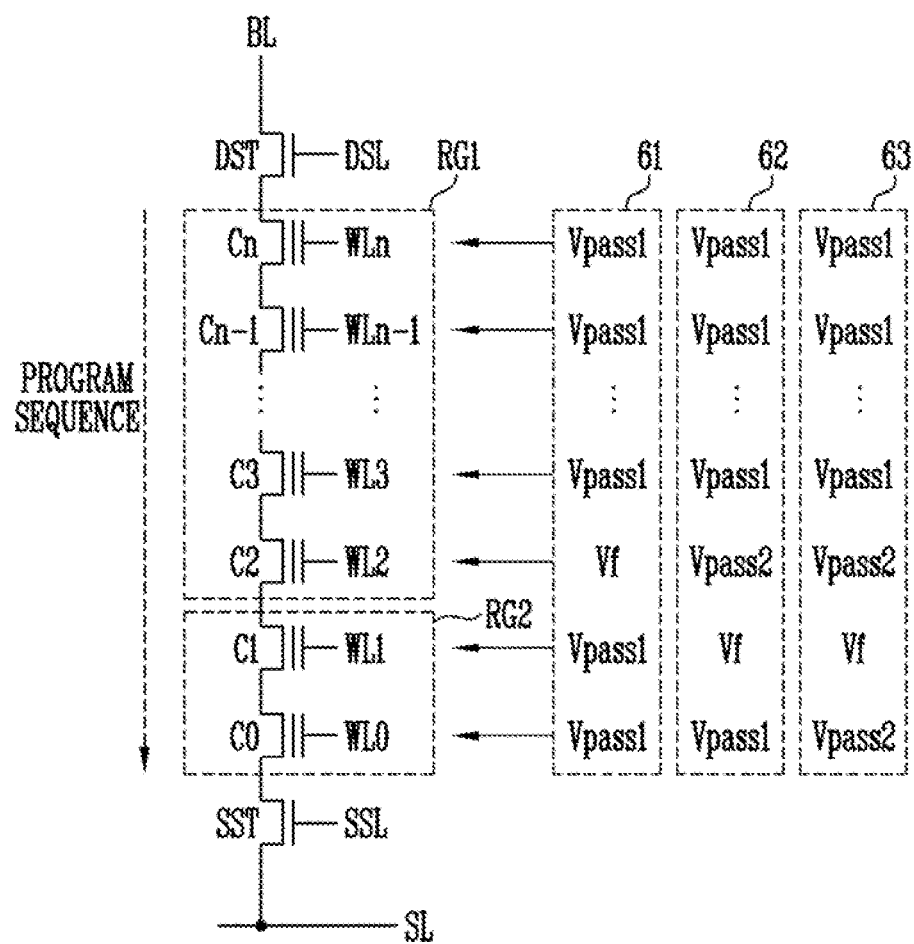
FIG. 6 is a diagram illustrating a program verify operation of a memory device including the cell string of FIG. 5, according to an embodiment of the present disclosure.

FIG. 6 is a diagram illustrating a program verify operation of a memory device including the cell string of FIG. 5 according to an embodiment of the present disclosure.

Referring to FIG. 6, a program operation is sequentially performed in a sequence of memory cells from a memory cell Cn located in an upper portion of the cell string to a memory cell C0 located in a lower portion of the cell string. The first pass voltage Vpass1 may be used in a program verify operation on the memory cells Cn to C2 included in the first pillar region RG1, and the second pass voltage Vpass2 may be used in a program verify operation on the memory cells C1 and C0 included in the second pillar region RG2.

For example, when the nth memory cell Cn included in the first pillar region RG1 is verified, the verification voltage Vf may be applied to the nth word line WLn, and the first pass voltage Vpass1 may be applied to the (n−1)th to 0th word lines WLn−1 to WL0. When the second memory cell C2 included in the first pillar region RG1 is verified (61), the verification voltage Vf may be applied to the second word line WL2, and the first pass voltage Vpass1 may be applied to the nth to third word lines WLn to WL3 and the first and 0th word lines WL1 and WL0. The first pass voltage Vpass1 may be set to a voltage identical to a read pass voltage used in a read operation.

When the first memory cell C1 included in the second pillar region RG2 is verified (62 or 63), the verification voltage Vf may be applied to the first word line WL1, and the first and second pass voltages Vpass 1 or Vpass2 may be selectively applied to the nth to second word lines WLn to WL2 and the 0th word line WL0. That is, the second pass voltage Vpass2 higher than the read pass voltage used in the read operation may be used in the program verify operation on the memory cells included in the second pillar region RG2 in which the width of the pillar is small.

TABLE 1

| | | RG1 | RG2 |
|---|---|---|---|
| Program verify operation | Verification voltage | | Vf |
| | Program pass voltage | Vpass1 | Vpass1, Vpass2 (Vpass2 > Vpass1) |
| Read operation | Read voltage | | Vr |
| | Read Pass voltage | | Vpass1 |

Referring to Table 1, during a read operation, a read voltage Vr may be applied to a selected word line and the read pass voltage Vpass1 may be applied to the unselected word lines, regardless of the first and second pillar regions RG1 and RG2. Here, the read voltage Vr may vary according to the memory cell to be read.

Unlike the read operation, during the program verify operation, the program pass voltage is adjusted depending on the location of the selected word line. For example, when the selected word line is included in the first pillar region RG1 (61), the verification voltage Vf may be applied to the selected word line, and the first pass voltage Vpass1 may be applied to the unselected word lines. Here, the first pass voltage Vpass1 may be a voltage identical to the read pass voltage Vpass1 used in the read operation.

When the selected word line is included in the second pillar region RG2 (62 or 63), the verification voltage Vf may be applied to the selected word line, the first pass voltage Vpass1 may be applied to a first group of unselected word lines, and the second pass voltage Vpass2 which is higher than the first pass voltage Vpass1 may be applied to a second group of the unselected word lines. For example, when the selected word line is included in the second pillar region RG2, the second pass voltage Vpass2 may be applied to unselected word lines which are adjacent to the selected word line, and the first pass voltage Vpass1 may be applied to the remaining unselected word lines. Assuming that the selected word line is the first word line WL1 included in the second pillar region RG2, the verification voltage Vf may be applied to the selected word line WL1. In this case, the second pass voltage Vpass2 may be applied to an unselected word line WL2 adjacent to the top of the selected word line WL1, and the first pass voltage Vpass1 may be applied to the remaining unselected word lines, that is, the 0th word line WL0 and the third to nth word lines WL3 and WLn (62). Alternatively, the second pass voltage Vpass2 may be applied to unselected word lines WL2 and WL0, respectively adjacent to the top and bottom of the selected word line WL1, and the first pass voltage Vpass1 may be applied to the remaining unselected word lines, that is, the third to nth word lines WL3 and WLn (63).

Figure 7:
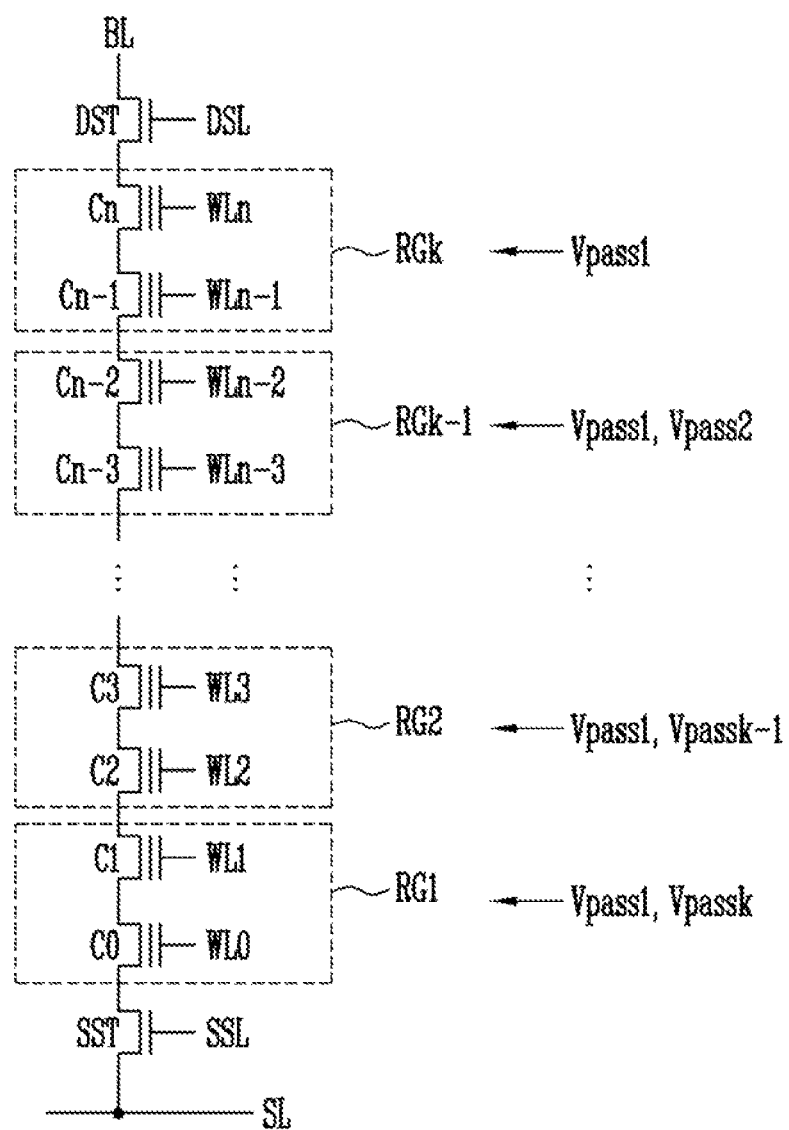
FIG. 7 is a diagram illustrating a program operation of a memory device in which the cell string of FIG. 5 is divided into a plurality of groups, according to an embodiment of the present disclosure.

FIG. 7 is a diagram illustrating a program operation of a memory device in which the cell string of FIG. 5 is divided into a plurality of groups according to an embodiment of the present disclosure.

Referring to FIG. 7, word lines WL0 to WLn coupled to a single cell string may be divided into a plurality of pillar regions, and a program pass voltage may be adjusted depending on the pillar region including a selected word line.

TABLE 2

|  |  | RGk | RGk-1 | ... | RG2 | RG1 |
|---|---|---|---|---|---|---|
| program verify operation | Verification voltage |  |  | Vf |  |  |
|  | Program pass voltage | Vpass1 | Vpass1, Vpass2 (Vpass2 > Vpass1) | ... | Vpass1, Vpassk-1 (Vpassk-1 > Vpassk-2) | Vpass1, Vpassk (Vpassk > Vpassk-1) |
| Read operation | Read voltage |  |  | Vr |  |  |
|  | Read pass voltage |  |  | Vpass1 |  |  |

Referring to Table 2, it is assumed that, among the first to kth pillar regions RG1 to RGk, the first pillar region RG1 is located in a lowermost portion, and the kth pillar region RGk is located in an uppermost portion. During a read operation, regardless of the kth to first pillar regions RGk to RG1, a read voltage Vr may be applied to a selected word line, and a read pass voltage Vpass1 may be applied to the unselected word lines. Here, the read voltage Vr may vary according to the memory cell to be read.

Unlike the read operation, during a program verify operation, the program pass voltage that is applied to unselected word lines is adjusted depending on the location of the selected word line, and a verification voltage Vf is maintained at a constant voltage when target voltages of selected memory cells are identical to each other. For example, when the selected word line is included in the kth pillar region RGk, the verification voltage Vf may be applied to the selected word line, and a first pass voltage Vpass1 may be applied to the unselected word lines. Here, the first pass voltage Vpass1 may be set to a voltage identical to the read pass voltage Vpass1 used in the read operation.

When the selected word line is included in the (k-1)th pillar region RGk-1, the verification voltage Vf may be applied to the selected word line, a second pass voltage Vpass2 higher than the first pass voltage Vpass1 may be applied to unselected word lines adjacent to the selected word line, and the first pass voltage Vpass1 may be applied to the remaining unselected word lines. For example, when the selected word line is the (n-2)th word line WLn-2, the second pass voltage Vpass2 may be applied to the (n-1)th word line WLn-1, and the first pass voltage Vpass1 may be applied to the nth word line WLn and the (n-3)th to 0th word lines WLn-3 to WL0. Alternatively, when the selected word line is the (n-2)th word line WLn-2, the second pass voltage Vpass2 is applied to the (n-1)th and (n-3)th word lines WLn-1 and WLn-3, and the first pass voltage Vpass1 may be applied to the nth word line WLn and the (n-4)th to 0th word lines WLn-4 to WL0.

When the selected word line is included in the second pillar region RG2, the verification voltage Vf may be applied to the selected word line, and a (k-1)th pass voltage Vpassk-1 higher than a (k-2)th pass voltage Vpassk-2 may be applied to unselected word lines adjacent to the selected word line, and the first pass voltage Vpass1 may be applied to the remaining unselected word lines. The (k-1)th pass voltage Vpassk-1 is higher than the first pass voltage Vpass1. More specifically, when the selected word line is the second word line WL2, the (k-1)th pass voltage Vpassk-1 may be applied to the third word line WL3, and the first pass voltage Vpass1 may be applied to the nth to fourth word lines WLn to WL4 and the first and 0th word lines WL1 and WL0. Alternatively, when the selected word line is the second word line WL2, the (k-1)th pass voltage Vpassk-1 is applied to the third and first word lines WL3 and WL1, and the first pass voltage Vpass1 may be applied to the nth to fourth word lines WLn to WL4 and the 0th word line WL0.

In this way, when the selected word line is included in the first pillar region RG1, the verification voltage Vf may be applied to the selected word line, the kth pass voltage Vpassk higher than the (k-1)th pass voltage Vpassk-1 may be applied to unselected word lines adjacent to the selected word line, and the first pass voltage Vpass1 may be applied to the remaining unselected word lines. More specifically, when the selected word line is the first word line WL1, the kth pass voltage Vpassk may be applied only to the second word line WL2 or to the second and 0th word lines WL2 and WL0. Here, the first pass voltage Vpass1 may be applied to the remaining unselected word lines, except for the word lines to which the verification voltage Vf and the kth pass voltage Vpassk are applied. When the selected word line is the 0th word line WL0 located in the lowermost portion, the kth pass voltage Vpassk may be applied to the first word line WL1, and the first pass voltage Vpass1 may be applied to the nth to second word lines WLn to WL2.

As described above, as the location of the selected word line changes from the upper portion to the lower portion of the cell string, the program pass voltage applied to unselected word lines which are adjacent to the selected word line may gradually increase.

Figure 8:
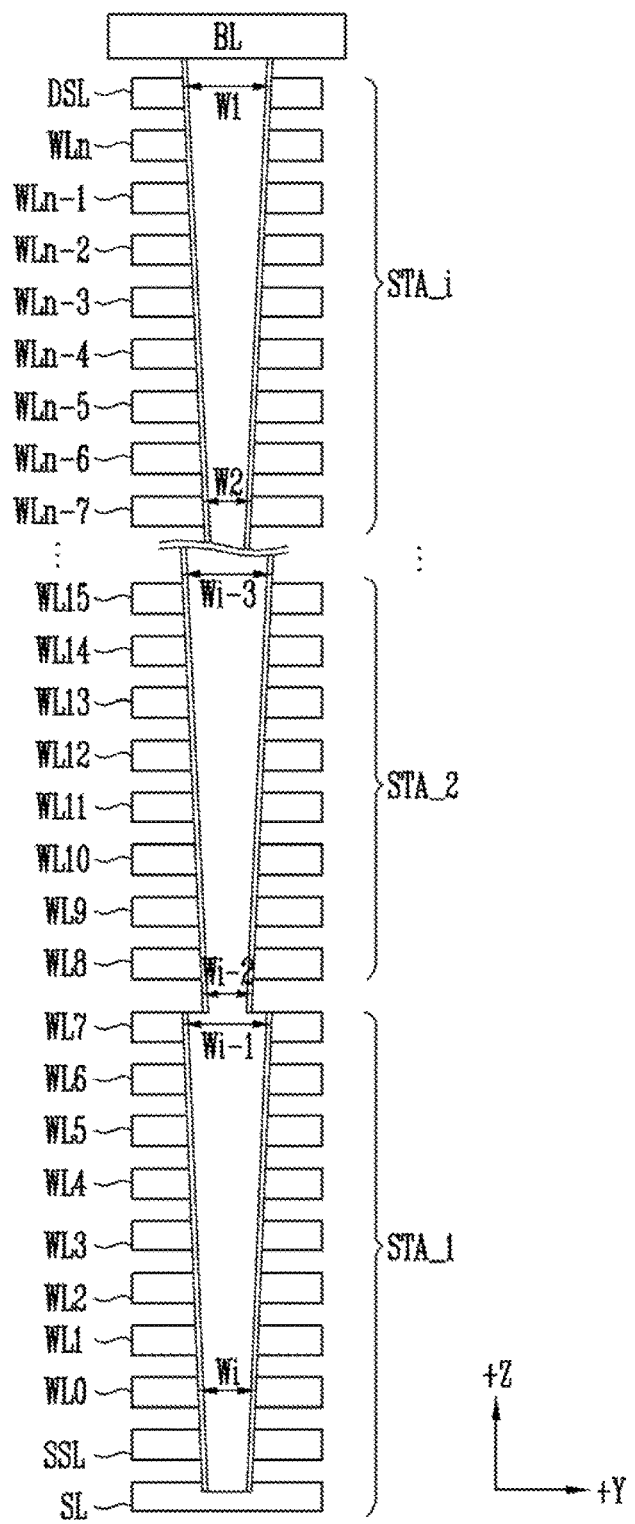
FIG. 8 is a sectional view illustrating a cell string formed in a multi-stack structure.

FIG. 8 is a sectional view illustrating a cell string formed in a multi-stack structure.

Referring to FIG. 8, the multi-stack structure may include a plurality of stacks STA_1 to STA_i are piled up between a source line SL and a bit line BL. The widths of pillars included in the piled stacks STA_1 to STA_i may be different from each other. Each of the stacks STA_1 to STA_i may include a pillar, the width of which is larger in an upper portion thereof and becomes gradually smaller in a direction towards a lower portion thereof. Thus, even if the location of the selected word line is lowered, the width of the corresponding pillar may be larger depending on a position of the current stack among the piled stacks STA_1 to STA_i. For example, assuming that the smallest width of the pillar in the first stack STA_1 is an ith width Wi, and the largest width of the pillar in the first stack STA_1 is an (i−1)th width Wi−1, the smallest width of the pillar of the second stack STA_2 formed on the top of the first stack STA_1 may be an (i−2)th width Wi−2 which is smaller than the (i−1)th width Wi−1, and the largest width of the pillar may be an (i−3)th width Wi−3. Here, the smallest ith width Wi of the pillar in the first stack STA_1 may be identical to or different from the smallest (i−2)th width Wi−2 in the second stack STA_2.

A program operation of a memory device having the above-described multi-stack structure will be described in detail below.

Figure 9:
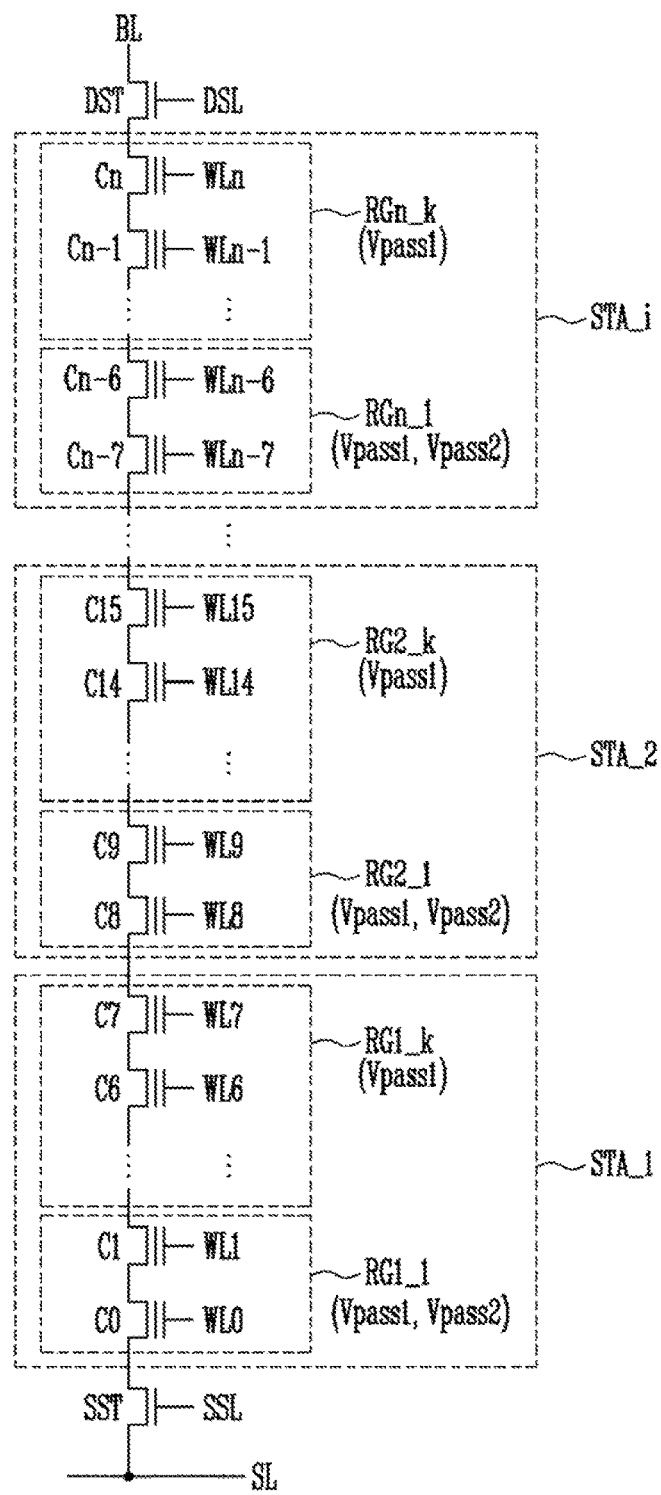
FIG. 9 is a diagram illustrating a program verify operation of a memory device including the cell string of FIG. 8, according to an embodiment of the present disclosure.

FIG. 9 is a diagram illustrating a program verify operation of a memory device including the cell string of FIG. 8 according to an embodiment of the present disclosure.

Referring to FIG. 9, a program operation may be performed in consideration of a single stack selected from any one of STA_1 to STA_i, in which a selected word line is included, and a pillar region, in which the selected word line is included, in the selected stack. More specifically, during a program verify operation, a program pass voltage may be adjusted depending on the location of the selected word line. For example, the program pass voltage may be adjusted depending on the width of a pillar included in the cell string. More specifically, the program pass voltage may be set so that it is further increased as the selected memory cell (or the selected word line) is located in a narrower pillar region.

As described above with reference to FIG. 7, respective stacks STA_1 to STA_i may be divided into a plurality of pillar regions RG1_1 to RG1_$k$, RG2_1 to RG2_$k$, . . . , RGn_1 to RGn_$k$, respectively.

When the selected word line is included in the kth pillar region RGn_$k$ that is located in an uppermost portion, among the pillar regions of the ith stack STA_i, the verification voltage Vf is applied to the selected word line, and a first pass voltage Vpass1 may be applied to the unselected word lines except for the selected word line. Here, the first pass voltage Vpass1 may be set to a voltage identical to the read pass voltage Vpass1 used in the read operation. When the selected word line is included in the first pillar region RGn_1 that is located in a lowermost portion, among the pillar regions of the ith stack STA_i, the verification voltage Vf is applied to the selected word line, a second pass voltage Vpass2 higher than the first pass voltage Vpass1 may be applied to unselected word lines adjacent to the top of or the top and bottom of the selected word line, and the first pass voltage Vpass1 may be applied to the remaining unselected word lines.

Assuming that the width of the pillar of the kth pillar region RG2_$k$ of the second stack STA_2 is formed to be larger than that of the pillar of the first pillar region RGn_1 of the ith stack STA_i, and that the selected word line is included in the kth pillar region RG2_$k$ of the second stack STA_2, the verification voltage Vf may be applied to the selected word line, and the first pass voltage Vpass1 may be applied to the unselected word lines.

When the selected word line is included in the first pillar region RG2_1 of the second stack STA_2, the verification voltage Vf is applied to the selected word line, the second pass voltage Vpass2 may be applied to unselected word lines adjacent to the top of or the top and bottom of the selected word line, and the first pass voltage Vpass1 may be applied to the remaining unselected word lines.

In this way, when the selected word line is included in the kth pillar region RG1_$k$ of the first stack STA_1, the

TABLE 3

| | | STA_i | | ... | STA_2 | | STA_1 | |
|---|---|---|---|---|---|---|---|---|
| | | RGn_k | RGn_1 | ... | RG2_k | RG2_1 | RG1_k | RG1_1 |
| Program verify operation | Verification voltage | Vf | | | Vf | | | |
| | Program pass voltage | Vpass1 | Vpass1, Vpass2 (Vpass2 > Vpass1) | | Vpass1 | Vpass1, Vpass2 | Vpass1 | Vpass1, Vpass2 |
| Read operation | Read voltage | Vr | | | Vr | | | |
| | Read pass voltage | | Vpass1 | | | Vpass1 | | |

In Table 3, a description will also be made below based on a read pass voltage in a read operation. During the read operation, a read voltage Vr may be applied to a selected word line, and the read pass voltage Vpass1 may be applied to the unselected word lines. Here, the read voltage Vr may vary according to the memory cell to be read.

Unlike the read operation, during a program verify operation, the program pass voltage is adjusted depending on the location of the selected word line, and a verification voltage Vf is maintained at a constant voltage when target voltages of selected memory cells are identical to each other, but the verification voltage Vf is adjusted according to the target level when the target voltages are different from each other.

Among these cases, the program pass voltage depending on the location of the selected word line will be described in detail below.

verification voltage Vf is applied to the selected word line, and the first pass voltage Vpass1 may be applied to the unselected word lines. When the selected word line is included in the first pillar region RG1_1 of the first stack STA_1, the verification voltage Vf is applied to the selected word line, the second pass voltage Vpass1 may be applied to unselected word lines adjacent to the top of or the top and bottom of the selected word line, and the first pass voltage Vpass1 may be applied to the remaining unselected word lines.

The above-described Tables 1, 2, and 3 are intended to describe pass voltages to be used in different embodiments, and thus the voltages described in respective tables are not associated with each other.

Figure 10:
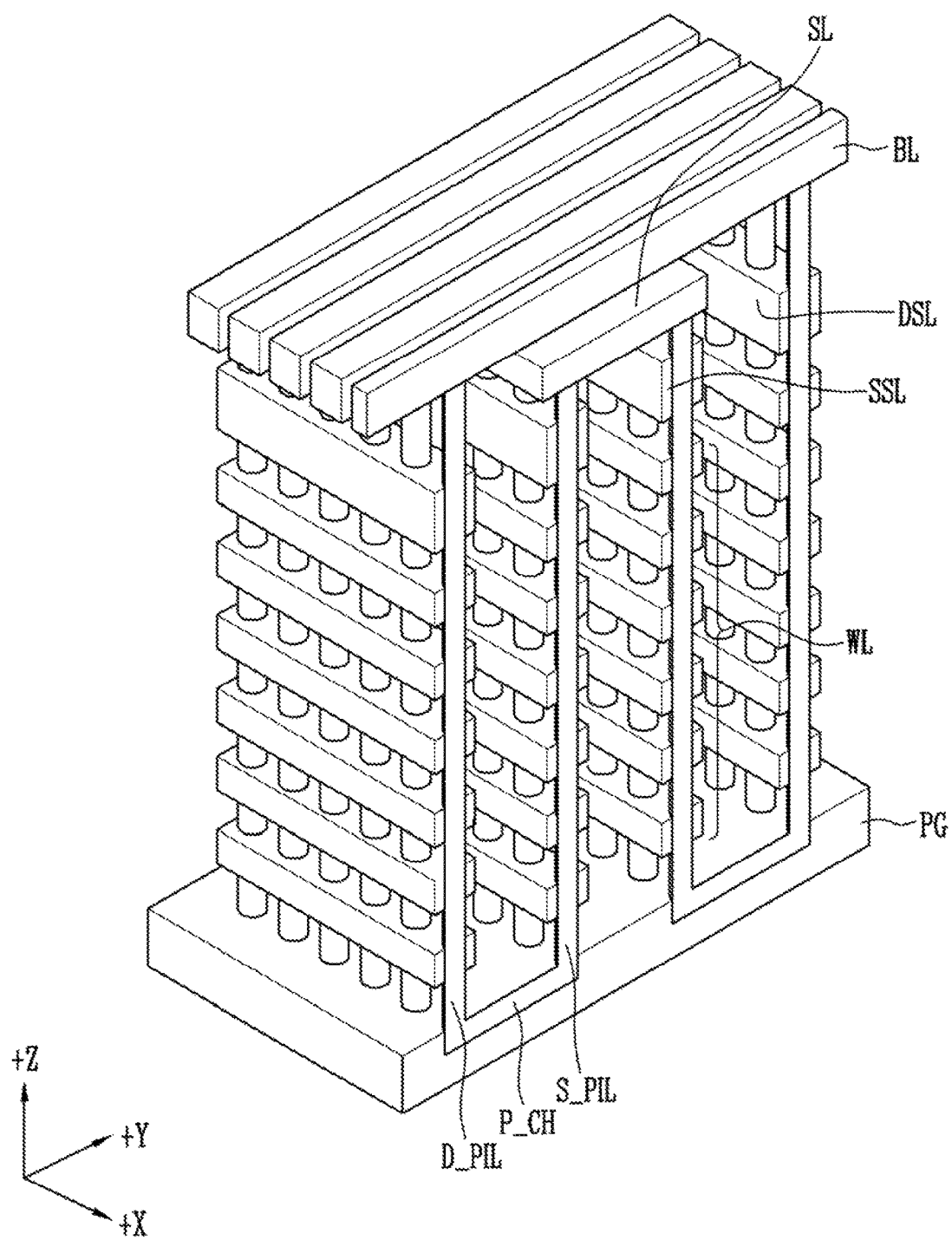
FIG. 10 is a perspective view illustrating another embodiment of a memory block configured in a 3D structure.

FIG. 10 is a perspective view illustrating another embodiment of a memory block configured in a 3D structure.

Referring to FIG. 10, the memory block implemented in a 3D structure may include cell strings ST, which are arranged vertically on a substrate (not shown), i.e., a Z direction, and are extended in a "U"-shape between bit lines BL and a source line SL. This structure is referred to as a "Pipe-Bit Cost Scalable (P-BiCS) structure". For example, each cell string ST may include a drain pillar D_PIL coupled to the bit line BL, a source pillar S_PIL coupled to the source line SL, and a pipe channel layer P_CH for coupling the drain and source pillars D_PIL and S_PIL to each other. The top of the source pillar S_PIL is coupled to the source line SL, and the bottom of the source pillar S_PIL is coupled to the pipe channel layer P_CH. The top of the drain pillar D_PIL is coupled to the bit line BL and the bottom of the drain pillar D_PIL is coupled to the pipe channel layer P_CH.

The pipe channel layer P_CH may be formed in a pipe gate PG extending in a Y direction, and the source pillar S_PIL and the drain pillar D_PIL may be formed at opposite ends of the pipe channel layer P_CH, in the Z direction vertical to the pipe gate PG. A plurality of word lines WLp to WL0 and a source select line SSL, which are sequentially stacked in the Z direction while being spaced apart from each other, may be formed along the source pillar S_PIL, and a plurality of word lines WLp+1 to WLn and a drain select line DSL, which are sequentially stacked in the Z direction while being spaced apart from each other, may be formed along the drain pillar D_PIL.

Figure 11:
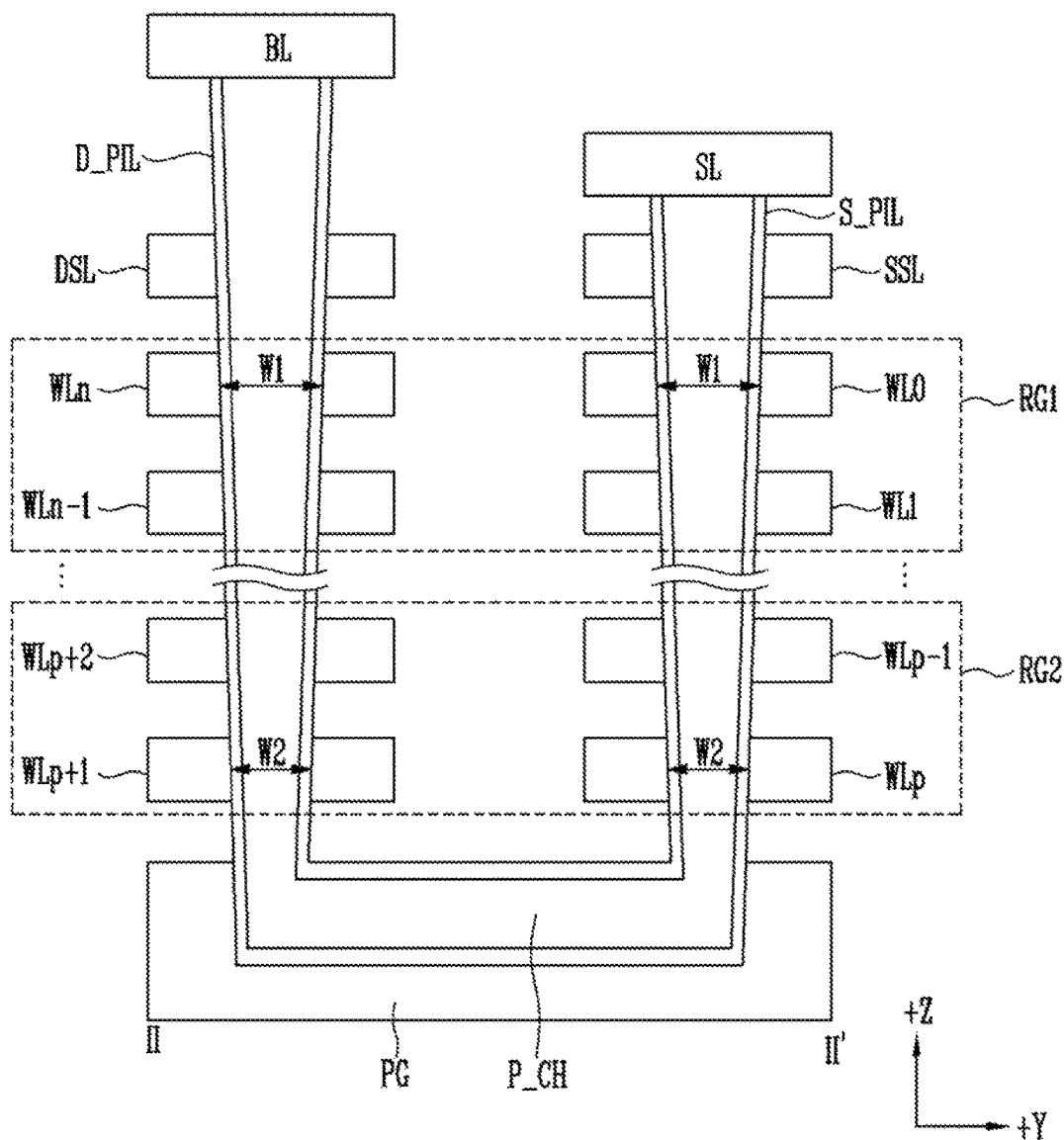
FIG. 11 is a sectional view illustrating a cell string formed in a single-stack structure.

FIG. 11 is a sectional view illustrating a cell string formed in a single-stack structure, and shows a cross section of the memory block having a P-BiCS structure, shown in FIG. 10.

Referring to FIG. 11, the single-stack structure denotes a single layered structure in which a pair of source pillar S_PIL and drain pillar D_PIL is formed on stacked word lines WL0 to WLn.

In the single stack having a P-BiCS structure, the source pillar S_PIL and the drain pillar D_PIL are formed to be paired, and thus the widths of pillars at the same height of the source and drain pillars S_PIL and D_PIL may be identical to each other. For example, assuming that the width of the pillar on which a 0th word line WL0 is formed in the source pillar S_PIL is a first width W1, the width of the pillar on which an nth word line WLn is formed in the drain pillar D_PIL may also be the first width W1. Further, assuming that the width of the pillar on which a pth word line WLp is formed in the source pillar S_PIL is a second width W2, the width of the pillar on which a (p+1)th word line WLp+1 is formed in the drain pillar D_PIL may also be the second width W2.

Due to the characteristics of a process for manufacturing a memory device, the widths of the source and drain pillars S_PIL and D_PIL become gradually smaller in a direction from the top to the bottom. Thus, the present embodiment increases a program pass voltage that is applied to unselected word lines adjacent to a selected word line when verifying memory cells present in a region in which the widths of the source or drain pillar S_PIL or D_PIL are smaller than a reference width.

A region in which 0th and first word lines WL0 and WL1 coupled to the source pillar S_PIL and nth and (n−1)th word lines WLn and WLn−1 coupled to the drain pillar D_PIL are included may be defined as a first pillar region RG1. A region in which (p−1)th and pth word lines WLp−1 and WLp coupled to the source pillar S_PIL and (p+2)th and (p+1)th word lines WLp+2 and WLp+1 coupled to the drain pillar D_PIL are included may be defined as a second pillar region RG2. It is assumed that the first width W1 is greater than or equal to the reference width, and the second width W2 is smaller than the reference width.

During a program verify operation, when a selected word line is included in the first pillar region RG1, a first pass voltage Vpass1 may be applied to unselected word lines. When the selected word line is included in the second pillar region RG2, the width of which is smaller than that of the first pillar region RG1, a verification voltage may be applied to the selected word line, a second pass voltage Vpass2 higher than the first pass voltage Vpass1 may be applied to unselected word lines adjacent to the selected word line, and the first pass voltage Vpass1 may be applied to the remaining unselected word lines.

A program verify operation on the above-described cell string will be described in detail below.

Figure 12:
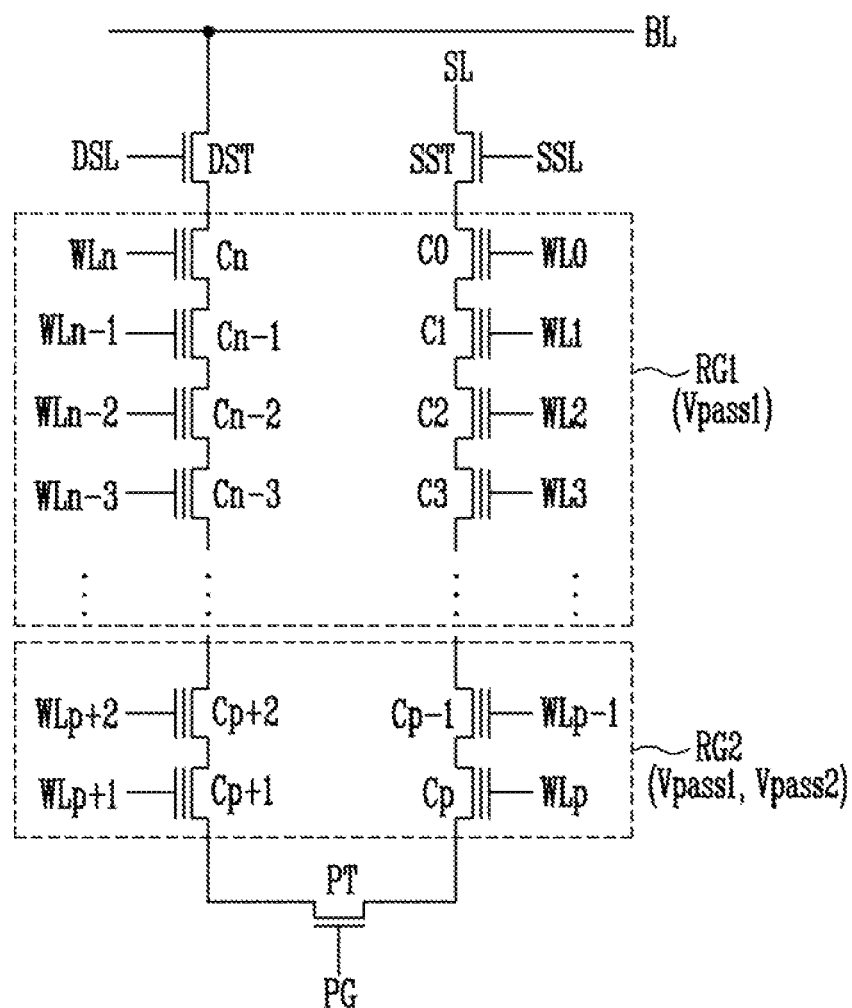
FIG. 12 is a diagram illustrating a program verify operation of a memory device including the cell string of FIG. 11, according to an embodiment of the present disclosure.

FIG. 12 is a diagram illustrating a program verify operation of a memory device including the cell string of FIG. 11 according to an embodiment of the present disclosure.

Referring to FIG. 12, when a program operation is sequentially performed in the sequence of memory cells from memory cells C0 and Cn located in an upper portion of the cell string to memory cells Cp and Cp+1 located in a lower portion of the cell string, a first pass voltage Vpass1 may be applied to unselected word lines during a program verify operation on the memory cells C0 to Cp−2 and Cn to Cp+3 included in the first pillar region RG1. During a program verify operation on memory cells Cp−1, Cp, Cp+1 and Cp+2 included in the second pillar region RG2, a second pass voltage Vpass2 higher than the first pass voltage Vpass1 may be applied to unselected word lines adjacent to the selected word line, and the first pass voltage Vpass1 may be applied to the remaining unselected word lines.

TABLE 4

|  |  | RG1 | RG2 |
|---|---|---|---|
| Program verify operation | Verification voltage |  | Vf |
|  | Program pass voltage | Vpass1 | Vpass1, Vpass2 (Vpass2 > Vpass1) |
| Read operation | Read voltage |  | Vr |
|  | Read Pass voltage |  | Vpass1 |

Referring to Table 4, during the program verify operation, when the nth memory cell Cn is verified, a verification voltage Vf may be applied to the nth word line WLn, and the first pass voltage Vpass1 may be applied to the unselected (n−1)th to 0th word lines WLn−1 to WL0. Even in the case where the second memory cell C2 included in the first pillar region RG1 is verified, the verification voltage Vf may be applied to the second word line WL2, and the first pass voltage Vpass1 may be applied to the unselected nth to third word lines WLn to WL3 and the first and 0th word lines WL1 and WL0. Here, the first pass voltage Vpass1 may be set to a voltage identical to a read pass voltage Vpass1 used in a read operation.

When the pth memory cell Cp included in the second pillar region RG2 is verified, the verification voltage Vf may be applied to the pth word line WLp, the second pass voltage Vpass2 may be applied to the (p−1)th word line WLp−1, and the first pass voltage Vpass1 may be applied to the remaining unselected word lines. That is, during the program verify operation on the memory cells included in the second pillar region RG2 having a narrow pillar, the second pass voltage Vpass2 higher than the first pass voltage Vpass1 may be applied to unselected word lines adjacent to the selected word line, and the first pass voltage Vpass1 may be applied to the remaining unselected word lines.

Figure 13:
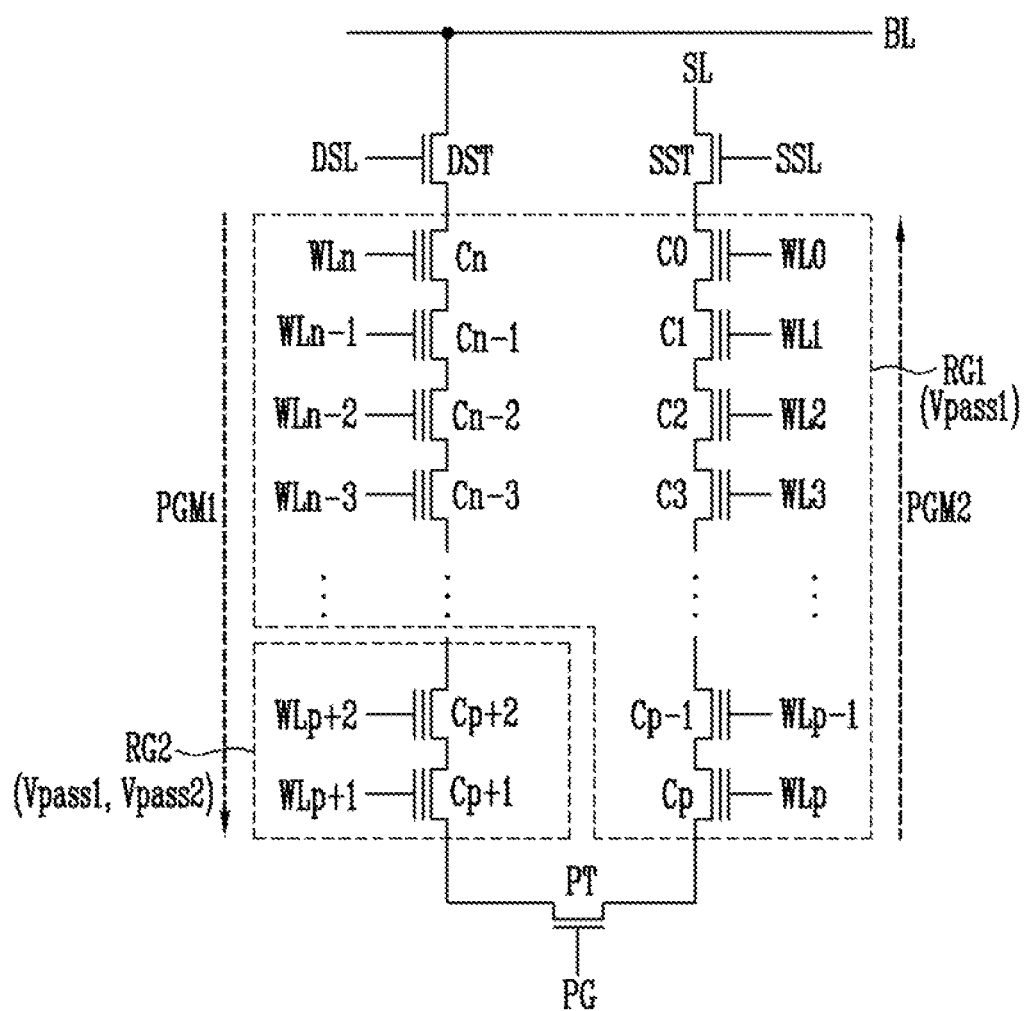
FIG. 13 is a diagram illustrating a program verify operation of a memory device including the cell string of FIG. 11, according to an embodiment of the present disclosure.

FIG. 13 is a diagram illustrating a program verify operation of a memory device including the cell string of FIG. 11 according to an embodiment of the present disclosure.

Referring to FIG. 13, a program pass voltage that is applied to unselected word lines during the program verify operation may be set depending on the sequence of a program operation and the location of a selected memory cell. This will be described in detail below.

A program operation may be sequentially performed in the sequence of memory cells from an nth memory cell Cn to a (p+1)th memory cell Cp+1, and may be sequentially performed in the sequence of memory cells from a pth memory cell Cp to a 0th memory cell C0. Here, the program operation sequentially performed in the sequence of memory cells from the nth memory cell Cn to the (p+1)th memory cell Cp+1 is defined as a first program operation PGM1, and the program operation sequentially performed in the sequence of memory cells from the pth memory cell Cp to the 0th memory cell C0 is defined as a second program operation PGM2.

A region in which some memory cells that are located in a relatively low portion of the cell string, among the 0th to nth memory cells C0 to Cn, are included may be classified as a second pillar region RG2, and a region in which the remaining memory cells are included may be classified as a first pillar region RG1. More specifically, the second pillar region RG2 may include memory cells located in a lower portion of the cell string, among memory cells on which the first program operation PGM1 is performed. The memory cells on which the second program operation PGM2 is performed are not included in the second pillar region RG2.

For example, when a program verify operation is performed on a (p+2)th memory cell Cp+2 included in the second pillar region RG2, a verification voltage may be applied to a selected (p+2)th word line WLp+2, and a second pass voltage Vpass1 may be applied either to a (p+3)th word line WLp+3 or to the (p+3)th and (p+1)th word lines WLp+3 and WLp+1, adjacent to the selected (p+2)th word line WLp+2. Further, the first pass voltage Vpass1 may be applied to the remaining unselected word lines. When a program verify operation is performed on the (p−1)th memory cell Cp−1 located on the same layer as the (p+2)th memory cell Cp+2, a (p−2)th memory cell Cp−2 is not yet programmed, and thus the first pass voltage Vpass1 may be applied to all unselected word lines. Here, the first pass voltage Vpass1 may be identical to a read pass voltage applied to unselected word lines during a read operation.

Figure 14:
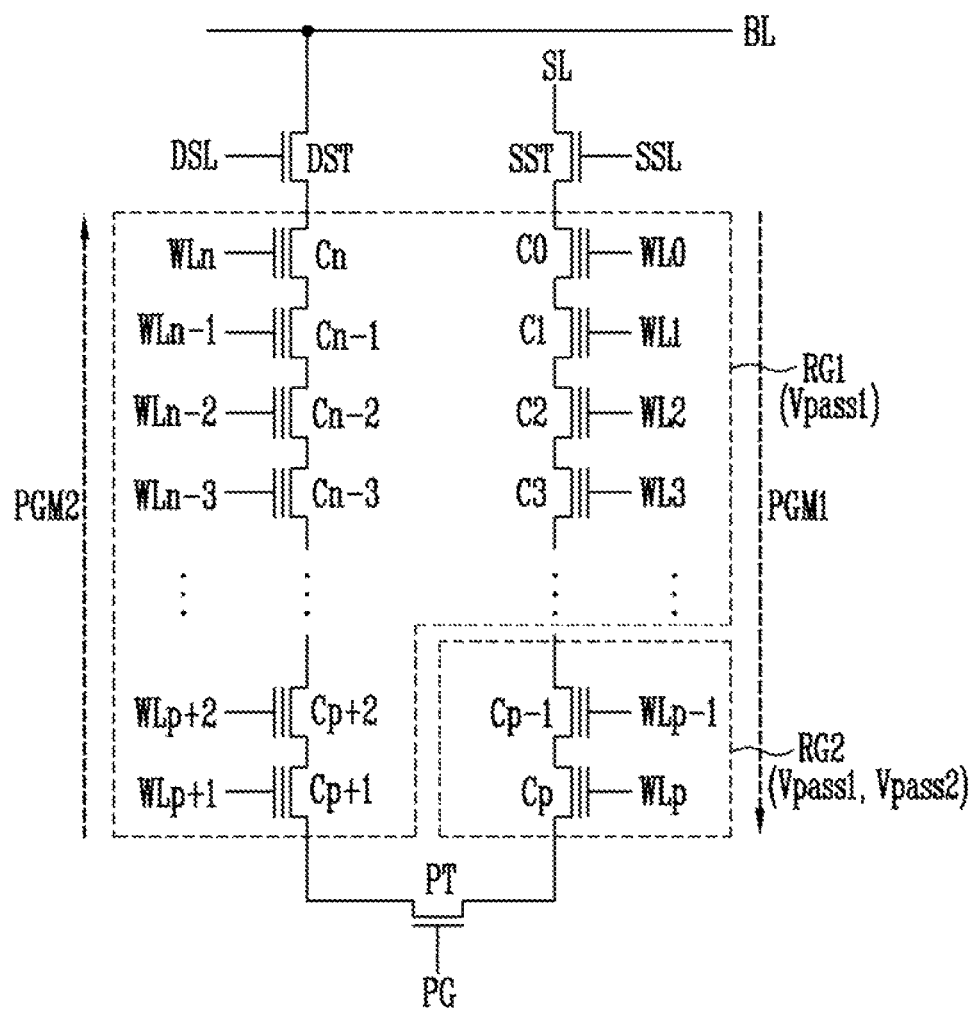
FIG. 14 is a diagram illustrating a program verify operation of a memory device including the cell string of FIG. 11, according to an embodiment of the present disclosure.

FIG. 14 is a diagram illustrating a program verify operation of a memory device including the cell string of FIG. 11 according to an embodiment of the present disclosure.

Referring to FIG. 14, unlike the above-described embodiment of FIG. 13, a first program operation PGM1 may be sequentially performed in the sequence of memory cells from a 0th memory cell C0 to a pth memory cell Cp, and a second program operation PGM2 may be sequentially performed in the sequence of memory cells from a (p+1)th memory cell Cp+1 to an nth memory cell Cn. In this case, a second pillar region RG2 may include memory cells Cp−1 and Cp which are located in a relatively low portion of the cell string, among the memory cells C0 to Cp on which the first program operation PGM1 is performed. The memory cells C0 to Cp−2 and Cp+1 to Cn, which are not included in the second pillar region RG2, may be included in a first pillar region RG1.

When a program verify operation is performed on the memory cell Cp or Cp−1 included in the second pillar region RG2, a verification voltage may be applied to a selected word line, a second pass voltage Vpass2 may be applied to unselected word lines adjacent to the selected word line, and a first pass voltage Vpass1 may be applied to the remaining unselected word lines. When a program verify operation is performed on the memory cell Cp+1 or Cp+2 located on the same layer as the memory cell Cp or Cp−1 included in the second pillar region RG2, the first pass voltage Vpass1 lower than the second pass voltage Vpass1 may be applied to unselected word lines. Here, the first pass voltage Vpass1 may be identical to a read pass voltage applied to unselected word lines during a read operation.

Figure 15:
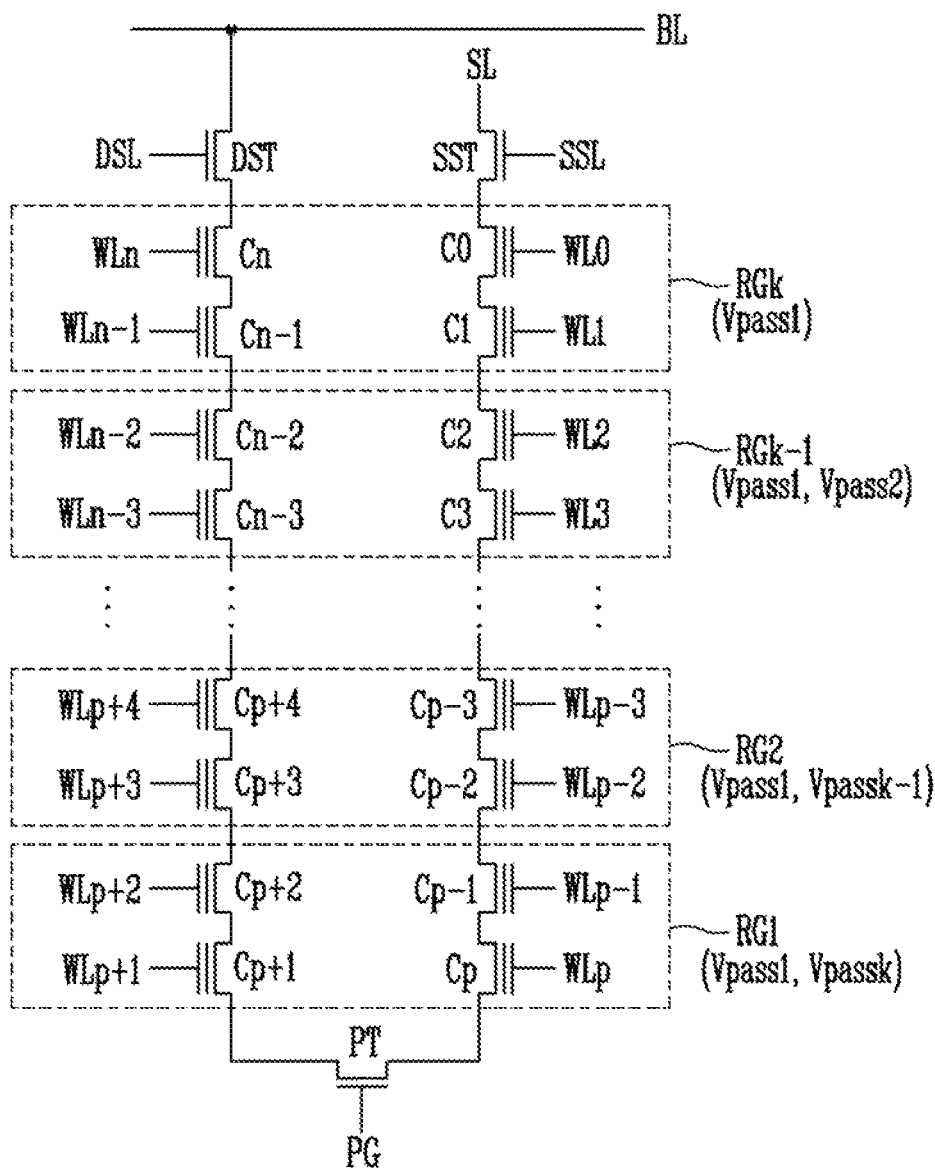
FIG. 15 is a diagram illustrating a program verify operation of a memory device in which the cell string of FIG. 11 is divided into a plurality of groups, according to an embodiment of the present disclosure.

FIG. 15 is a diagram illustrating a program verify operation of a memory device in which the cell string of FIG. 11 is divided into a plurality of groups according to an embodiment of the present disclosure.

Referring to FIG. 15, word lines WL0 to WLp and WLn to WLp+1 respectively coupled to source and drain pillars may be divided into a plurality of pillar regions, and a program pass voltage may be adjusted depending on the pillar region in which a selected word line is included during a program verify operation.

TABLE 5

| | | RGk | RGk-1 | ... | RG2 | RG1 |
|---|---|---|---|---|---|---|
| Program verify operation | Verification voltage | | | | Vf | |
| | Program pass voltage | Vpass1 | Vpass1, Vpass2 (Vpass2 > Vpass1) | ... | Vpass1, Vpassk-1 (Vpassk-1 > Vpassk-2) | Vpass1, Vpassk (Vpassk > Vpassk-1) |
| Read operation | Read voltage | | | Vr | | |
| | Read pass voltage | | | Vpass1 | | |

Referring to Table 5, it is assumed that, among first to kth pillar regions RG1 to RGk, the first pillar region RG1 is located in a lowermost portion and the kth pillar region RGk is located in an uppermost portion. During a read operation, regardless of the kth to first pillar regions RGk to RG1, a read voltage Vr may be applied to a selected word line, and a read pass voltage Vpass1 may be applied to the unselected word lines. Here, the read voltage Vr may vary depending on the memory cell to be read.

Unlike the read operation, during a program verify operation, the program pass voltage is adjusted depending on the location of the selected word line, and a verification voltage Vf is maintained at a constant voltage when target voltages of selected memory cells are identical to each other. For example, when the selected word line is included in the kth pillar region RGk that is located in the uppermost portion, among the pillar regions, the verification voltage Vf may be applied to the selected word line, and a first pass voltage Vpass1 may be applied to the unselected word lines. Here, the first pass voltage Vpass1 may be set to a voltage identical to the read pass voltage Vpass1 used in the read operation.

When the selected word line is included in the (k−1)th pillar region RGk-1 lower than the kth pillar region RGk, the verification voltage Vf may be applied to the selected word line, a second pass voltage Vpass1 higher than the first pass voltage Vpass1 may be applied to unselected word lines adjacent to the selected word line, and the first pass voltage Vpass1 may be applied to the remaining unselected word lines. In this way, when the selected word line is included in the first pillar region RG1, the verification voltage Vf may be applied to the selected word line, a kth pass voltage Vpassk higher than a (k−1)th pass voltage Vpassk−1 may be applied to unselected word lines adjacent to the selected word line, and the first pass voltage Vpass1 may be applied to the remaining unselected word lines. That is, as the location of the selected word line changes from the upper portion to the lower portion of the cell string, the program pass voltage applied to unselected word lines adjacent to the selected word line may be set to a gradually increased voltage. In this regard, the first pass voltage Vpass1 may be applied to the remaining unselected word lines.

Figure 16:
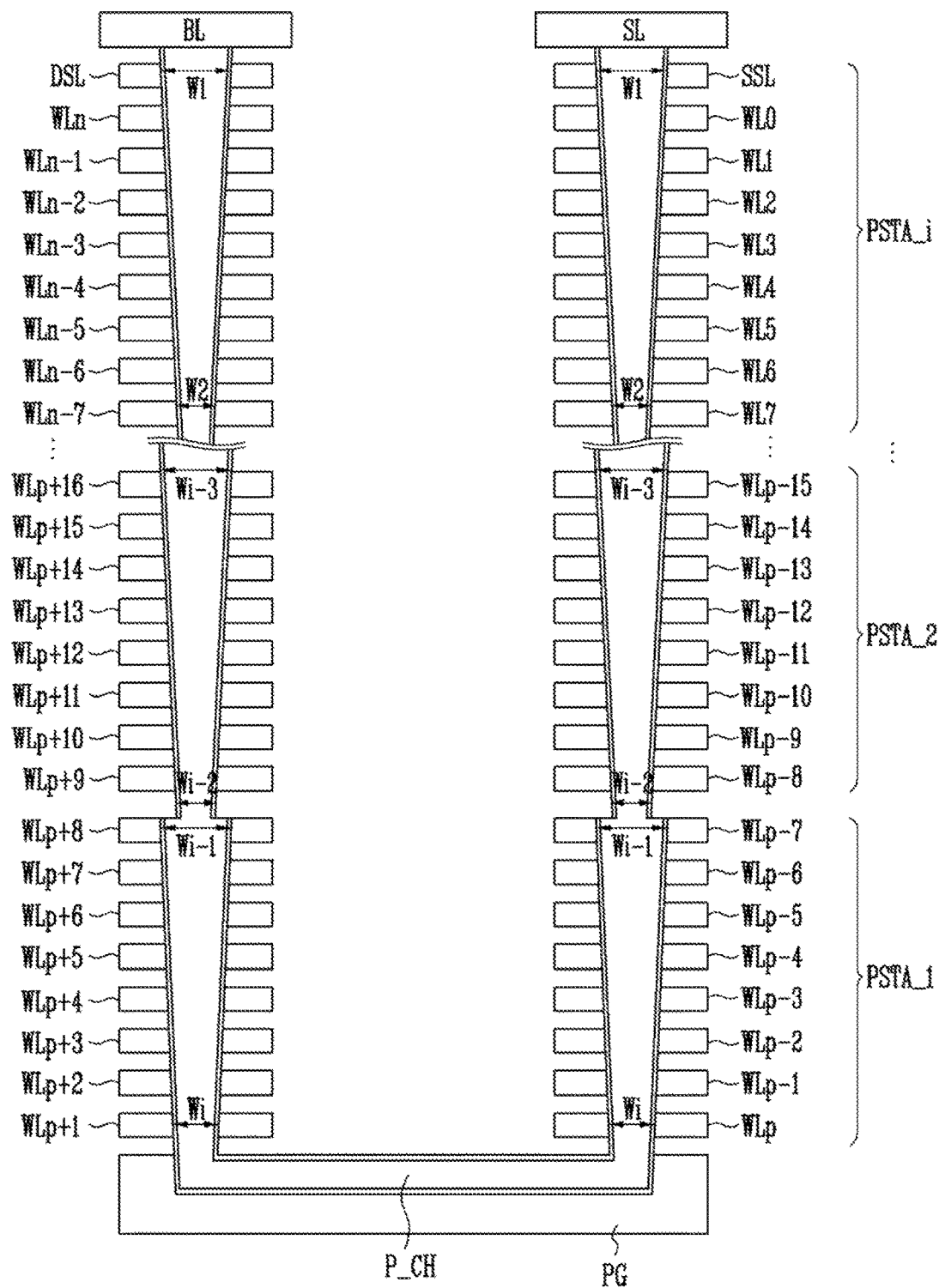
FIG. 16 is a sectional view illustrating a cell string formed in a multi-stack structure.

FIG. 16 is a sectional view illustrating a cell string formed in a multi-stack structure.

included, and a pillar region, in which the selected word line is included, in the corresponding stack. More specifically, during a program verify operation, a program pass voltage may be adjusted depending on the location of the selected word line. For example, the program pass voltage may be adjusted depending on the width of a pillar included in the cell string. More specifically, the program pass voltage may be set so that it is further increased as the selected memory cell (or the selected word line) is located in a narrower pillar region.

As described above with reference to FIG. 15, respective stacks PSTA_1 to PSTA_i may be divided into a plurality of pillar regions RG1_1 to RG1_k, RG2_1 to RG2_k, . . . , RGn_1 to RGn_k, respectively.

TABLE 6

| | | PSTA_i | | ... | PSTA_2 | | PSTA_1 | |
|---|---|---|---|---|---|---|---|---|
| | | RGn_k | RGn_1 | ... | RG2_k | RG2_1 | RG1_k | RG1_1 |
| Program verify operation | Verification voltage | Vf | | | | Vf | | |
| | Program pass voltage | Vpass1 | Vpass1, Vpass2 (Vpass2 > Vpass1) | | Vpass1 | Vpass1, Vpass2 | Vpass1 | Vpass1, Vpass2 |
| Read operation | Read voltage | Vr | | | | Vr | | |
| | Read pass voltage | | Vpass1 | | | Vpass1 | | |

Referring to FIG. 16, the multi-stack structure denotes a structure in which a plurality of stacks PSTA_1 to PSTA_i are piled up between a pipe gate PG and a source line SL/bit line BL. In such a multi-stack structure, since the widths of pillars included in the piled stacks PSTA_1 to PSTA_i may differ from each other, a single stack in which a selected word line is included, among the piled stacks PSTA_1 to PSTA_i, may also be taken into consideration. That is, each of the stacks PSTA_1 to PSTA_i may include a pillar, the width of which is large in an upper portion thereof and becomes smaller in a direction to a lower portion thereof. Thus, even if the location of the selected word line is lowered, the width of the corresponding pillar may be larger depending on a position of the current stack among the piled stacks PSTA_1 to PSTA_i. For example, assuming that the smallest width of the pillar in the first stack PSTA_1 is an ith width Wi, and the largest width of the pillar in the first stack PSTA_1 is an (i−1)th width Wi−1, the smallest width of the pillar in the second stack PSTA_2 formed on the top of the first stack PSTA_1 may be an (i−2)th width Wi−2 which is smaller than the (i−1)th width Wi−1, and the largest width of the pillar in the second stack PSTA_2 may be an (i−3)th width Wi−3. Here, the smallest ith width Wi of the pillar in the first stack PSTA_1 may be identical to or different from the smallest (i−2)th width Wi−2 in the second stack PSTA_2.

A program operation of a memory device having the above-described multi-stack structure will be described in detail below.

Figure 17:
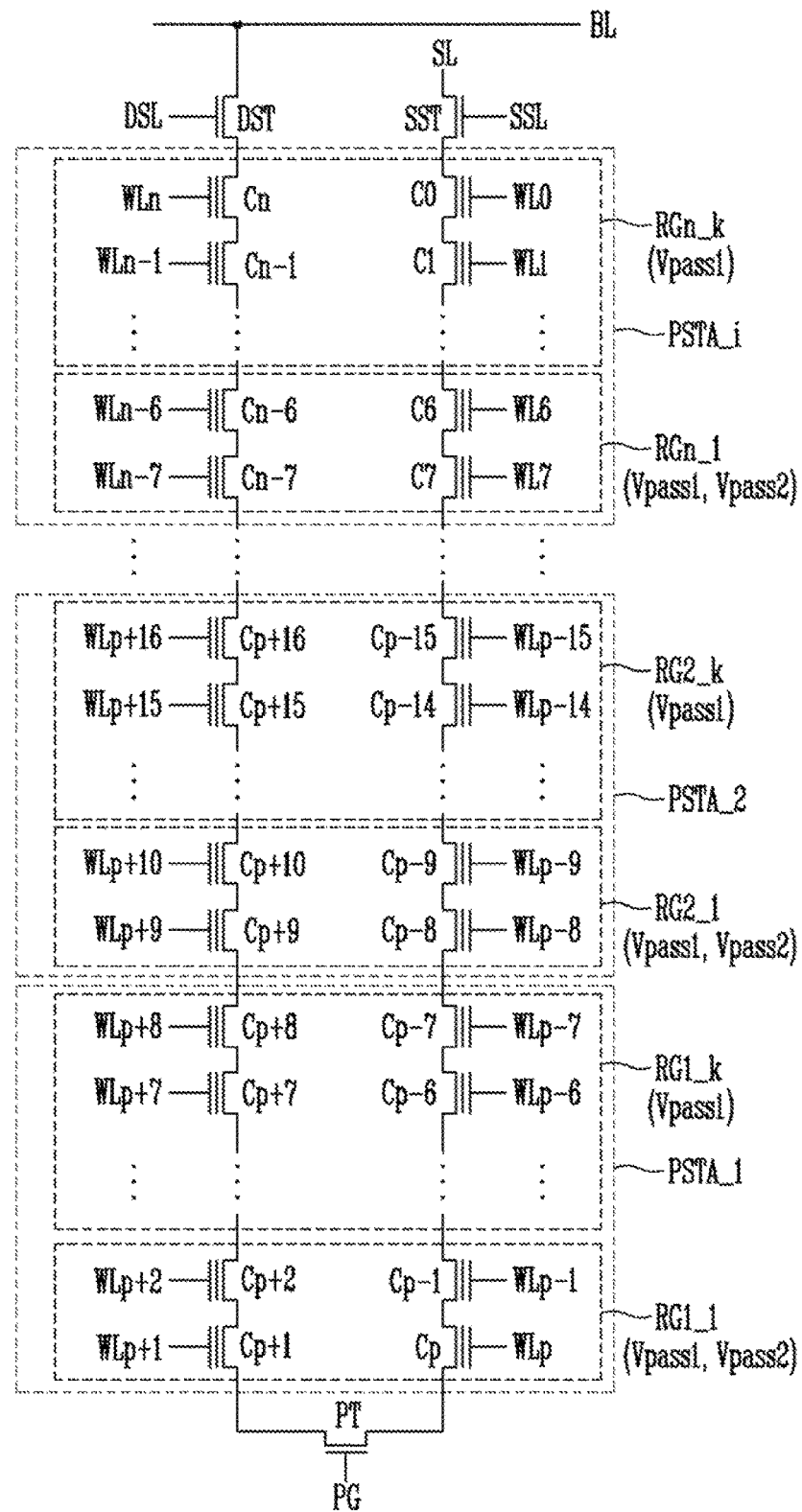
FIG. 17 is a diagram illustrating a program verify operation of a memory device including the cell string of FIG. 16, according to an embodiment of the present disclosure.

FIG. 17 is a diagram illustrating a program verify operation of a memory device including the cell string of FIG. 16 according to an embodiment of the present disclosure.

Referring to FIG. 17, a program operation may be performed in consideration of a single stack selected from any one of PSTA_1 to PSTA_i, in which a selected word line is In Table 6, a description will also be made below based on a read pass voltage in a read operation. During the read operation, a read voltage Vr may be applied to a selected word line, and the read pass voltage Vpass1 may be applied to the unselected word lines. Here, the read voltage Vr may vary according to the memory cell to be read.

Unlike the read operation, during a program verify operation, the program pass voltage is adjusted depending on the location of the selected word line, and a verification voltage Vf is maintained at a constant voltage when target voltages of selected memory cells are identical to each other, but the verification voltage Vf is adjusted according to the target level when the target voltages are different from each other.

Among these cases, the program pass voltage depending on the location of the selected word line will be described in detail below.

When the selected word line is included in the kth pillar region RGn_k of the ith stack PSTA_i which is located in an uppermost portion, among the pillar regions, the verification voltage Vf is applied to the selected word line, and a first pass voltage Vpass1 may be applied to all unselected word lines. Here, the first pass voltage Vpass1 may be set to a voltage identical to the read pass voltage Vpass1 used in the read operation. When the selected word line is included in the first pillar region RGn_1 that is located in a lowermost portion, among the pillar regions of the ith stack PSTA_i, the verification voltage Vf is applied to the selected word line, a second pass voltage Vpass2 higher than the first pass voltage Vpass1 may be applied to unselected word lines adjacent to the top of or the top and bottom of the selected word line, and the first pass voltage Vpass1 may be applied to the remaining unselected word lines.

Assuming that the width of the pillar of the kth pillar region RG2_k of the second stack PSTA_2 is formed to be larger than that of the pillar of the first pillar region RGn_1 of the ith stack PSTA_i, and that the selected word line is included in the kth pillar region RG2_k of the second stack PSTA_2, the verification voltage Vf may be applied to the selected word line, and the first pass voltage Vpass1 may be applied to the unselected word lines.

In this way, when the selected word line is included in the kth pillar region RG1_k of the first stack PSTA_1, the verification voltage Vf is applied to the selected word line, and the first pass voltage Vpass1 may be applied to the unselected word lines. When the selected word line is included in the first pillar region RG1_1 of the first stack PSTA_1, the verification voltage is applied to the selected word line, the second pass voltage Vpass1 may be applied to unselected word lines adjacent to the top of or the top and bottom of the selected word line, and the first pass voltage Vpass1 may be applied to the remaining unselected word lines.

The above-described Tables 4, 5, and 6 are intended to describe pass voltages to be used in different embodiments, and thus the voltages described in respective tables are not associated with each other.

As described above, the program pass voltage applied to unselected word lines adjacent to the selected word line is increased when memory cells included in a region having a narrow pillar are verified. Accordingly, the reliability of a program operation on memory cells may be improved by minimizing an influence due to a difference between the widths of pillars.

Figure 18:
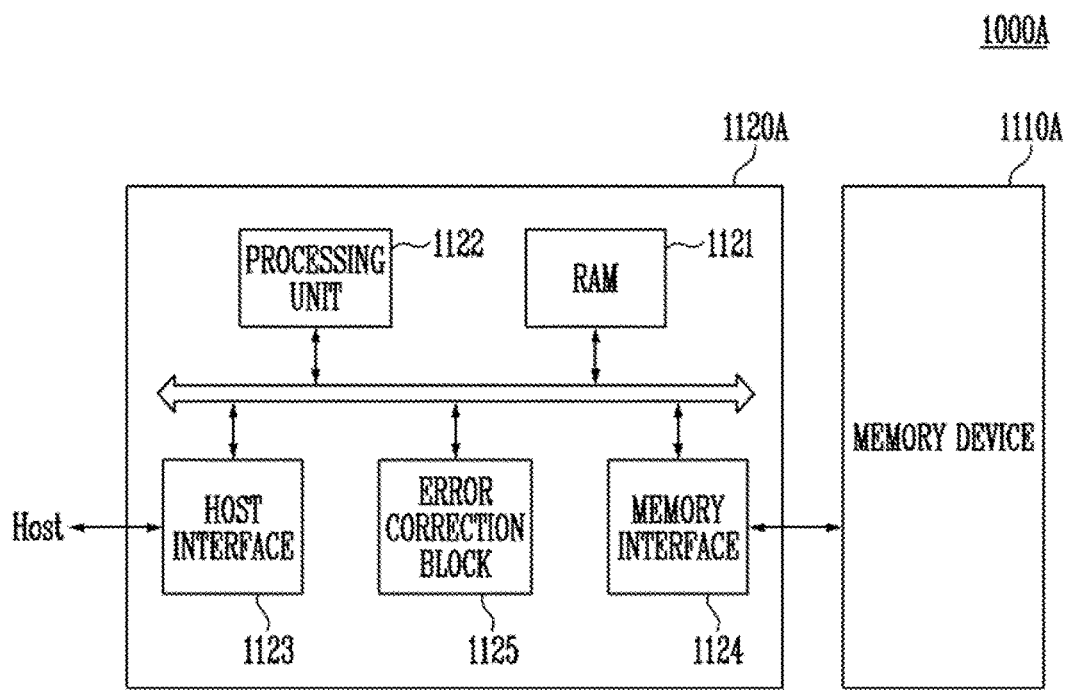
FIG. 18 is a block diagram illustrating a memory system according to an embodiment of the present disclosure.

FIG. 18 is a block diagram illustrating a memory system 1000A according to an embodiment of the present disclosure.

Referring to FIG. 18, the memory system 1000A includes a semiconductor memory device 1110A and a controller 1120A.

The semiconductor memory device 1110A may have the same configuration and operation as those of the memory device 1110 described with reference to FIG. 2. Hereinafter, repetitive explanations will be omitted.

The controller 1120A is coupled between a host and the semiconductor memory device 1110A. The controller 1120A is configured to access the semiconductor memory device 1110A in response to a request from the host. For example, the controller 1120A is configured to control read, write, erase, and background operations of the semiconductor memory device 1110A. The controller 1120A is configured to provide an interface between the host and the semiconductor memory device 1110A. The controller 1120A is configured to drive firmware for controlling the semiconductor memory device 1110A.

The controller 1120A includes a Random Access Memory (RAM) 1121, a processing unit 1122, a host interface 1123, a memory interface 1124, and an error correction block 1125. The RAM 1121 is used as at least one of an operation memory of the processing unit 1122, a cache memory between the semiconductor memory device 1110A and the host, and a buffer memory between the semiconductor memory device 1110A and the host. The processing unit 1122 controls the overall operation of the controller 1120A. In addition, the controller 1120A may temporarily store program data provided from the host during the write operation.

The host interface 1123 includes a protocol for performing data exchange between the host and the controller 1120A. In an exemplary embodiment, the controller 1120A is configured to communicate with the host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, and an integrated drive electronics (IDE) protocol, a private protocol, and the like.

The memory interface 1124 interfaces with the semiconductor memory device 1110A. For example, the memory interface includes a NAND interface or NOR interface.

The error correction block 1125 uses an error correcting code (ECC) to detect and correct an error in data received from the semiconductor memory device 1110A. The processing unit 1122 may adjust the read voltage according to an error detection result from the error correction block 1125, and control the semiconductor memory device 1110A to perform re-reading. In an exemplary embodiment, the error correction block 1125 may be provided as an element of the controller 1120A.

The controller 1120A and the semiconductor memory device 1110A may be integrated into a single semiconductor device. In an exemplary embodiment, the controller 1120A and the semiconductor memory device 1110A may be integrated into a single semiconductor device to form a memory card. For example, the controller 1120A and the semiconductor memory device 1110A may be integrated into a single semiconductor device and form a memory card such as a personal computer memory card international association (PCMCIA), a compact flash card (CF), a smart media card (SM or SMC), a memory stick multimedia card (MMC, RS-MMC, or MMCmicro), a SD card (SD, miniSD, microSD, or SDHC), a universal flash storage (UFS), and the like.

The controller 1120A and the semiconductor memory device 1110A may be integrated into a single semiconductor device to form a solid state drive (SSD). The SSD includes a storage device formed to store data in a semiconductor memory. When the memory system 1000A is used as the SSD, an operation speed of the host coupled to the memory system 1000A may be phenomenally improved.

In another embodiment, the memory system 1000A may be provided as one of various elements of an electronic device such as a computer, a ultra mobile PC (UMPC), a workstation, a net-book, a personal digital assistants (PDA), a portable computer, a web tablet, a wireless phone, a mobile phone, a smart phone, an e-book, a portable multimedia player (PMP), a game console, a navigation device, a black box, a digital camera, a 3-dimensional television, a digital audio recorder, a digital audio player, a digital picture recorder, a digital picture player, a digital video recorder, a digital video player, a device capable of transmitting/receiving information in an wireless environment, one of various devices for forming a home network, one of various electronic devices for forming a computer network, one of various electronic devices for forming a telematics network, an RFID device, one of various elements for forming a computing system, or the like.

In an exemplary embodiment, the semiconductor memory device 1110A or the memory system 1000A may be embedded in various types of packages. For example, the semiconductor memory device 1110A or the memory system 1000A may be packaged in a type such as Package on Package (PoP), Ball grid arrays (BGAs), Chip scale packages (CSPs), Plastic Leaded Chip Carrier (PLCC), Plastic Dual In Line Package (PDIP), Die in Waffle Pack, Die in Wafer Form, Chip On Board (COB), Ceramic Dual In Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), or the like.

Figure 19:
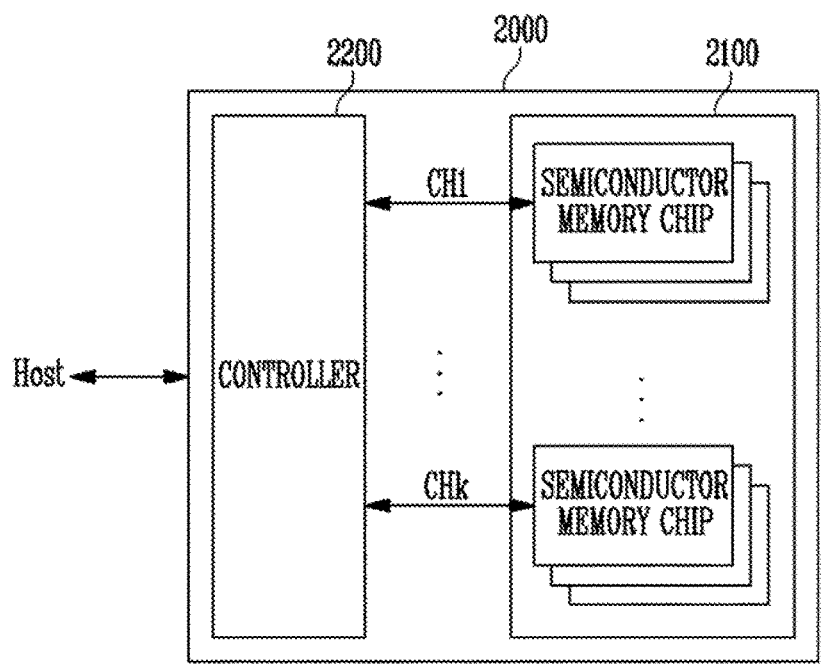
FIG. 19 is a block diagram illustrating a memory system according to an embodiment of the present disclosure.

FIG. 19 is a block diagram illustrating a memory system 2000 according to an embodiment of the present disclosure.

Referring to FIG. 19, the memory system 2000 includes a semiconductor memory device 2100 and a controller 2200. The semiconductor memory device 2100 includes a plurality of memory chips. The semiconductor memory chips are divided into a plurality of groups. It is illustrated that each of the plurality of groups communicates with the controller 2200 through first to kth channels CH1 to CHk. Each semiconductor memory chip may have the same configuration and operation as those of an embodiment of the semiconductor memory device 1110 described with reference to FIG. 2.

Each group communicates with the controller 2200 through one common channel. The controller 2200 has the same configuration as that of the controller 1120A described with reference to FIG. 18 and is configured to control a plurality of memory chips of the semiconductor memory device 2100 through the plurality of channels CH1 to CHk.

Figure 20:
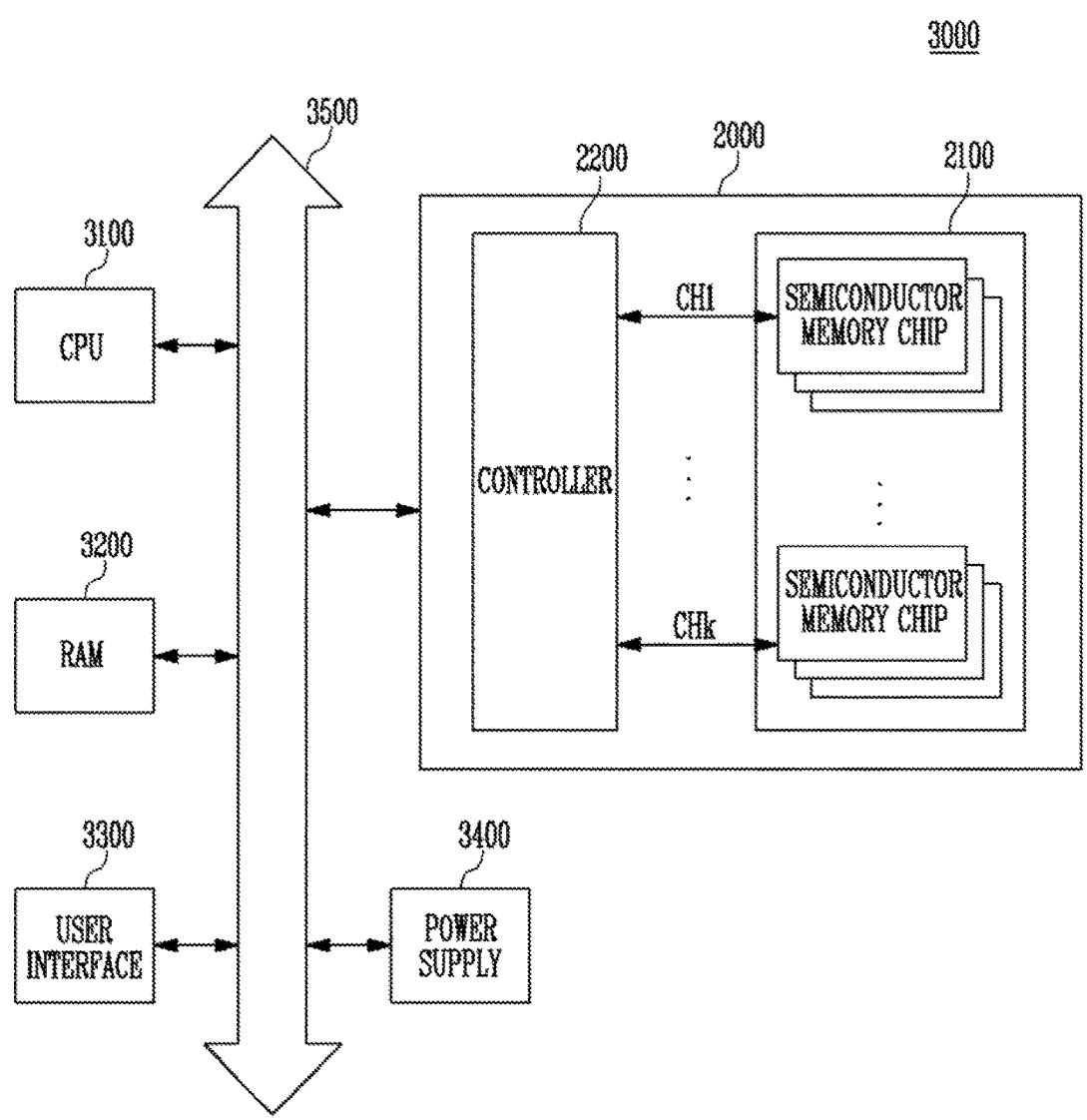
FIG. 20 is a block diagram illustrating a computing system including the memory system of FIG. 19, according to an embodiment of the present disclosure.

FIG. 20 is a block diagram illustrating a computing system 3000 including the memory system 2000 of FIG. 19 according to an embodiment of the present disclosure.

Referring to FIG. 20, the computing system 3000 may include a central processing unit 3100, a RAM 3200, a user interface 3300, a power supply 3400, a system bus 3500, and the memory system 2000.

The memory system 2000 is electrically coupled to the CPU 3100, the RAM 3200, the user interface 3300, and the power supply 3400 through the system bus 3500. Data provided through the user interface 3300 or processed by the CPU 3100 is stored in the memory system 2000.

In FIG. 20, the semiconductor memory device 2100 is illustrated as being coupled to the system bus 3500 through the controller 2200. However, the semiconductor memory device 2100 may be directly coupled to the system bus 3500. The function of the controller 2200 may be performed by the CPU 3100 and the RAM 3200.

In FIG. 20, the memory system 2000 described with reference to FIG. 19 is illustrated as being used. However, the memory system 2000 may be replaced with the memory system 1000A described with reference to FIG. 18. In an exemplary embodiment, the computing system 3000 may include all of the memory systems 1000A and 2000 described with reference to FIGS. 18 and 19.

The present disclosure may improve the reliability of a program operation of a 3D memory device.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A memory device, comprising:
a memory cell string configured to include a plurality of memory cells stacked on a substrate, wherein the plurality of memory cells are electrically connected to a plurality of word lines, respectively, and wherein the memory cell string includes a pillar penetrating through the plurality of word lines;
a peripheral circuit configured to program and to verify a selected memory cells coupled to a selected word line, among the plurality of memory cells; and
a control logic configured to control the peripheral circuit to apply a verification voltage to the selected word line, to apply a first pass voltage to unselected word lines excluding at least one unselected word line adjacent to the selected word line among the plurality of word lines, wherein the unselected word lines are electrically connected to unselected memory cells among the plurality of memory cells, respectively, and
to apply a second pass voltage different from the first pass voltage to the at least one unselected word line adjacent to the selected word line, depending on a width of a part of the pillar on which the selected word line is located.

2. The memory device according to claim 1, wherein the peripheral circuit is configured to output the first pass voltage or output the first pass voltage and the second pass voltage higher than the first pass voltage under control of the control logic.

3. The memory device according to claim 1, wherein the plurality of memory cells are divided into a plurality of regions depending on a width of a part of the pillar on which each of the plurality of word lines is located.

4. The memory device according to claim 3, wherein the control logic is configured to control the peripheral circuit to apply the second pass voltage different from the first pass voltage to at least one unselected word line which is adjacent to the selected memory cell, among the unselected word lines depending on a region on which the selected word line coupled to the selected memory cell is located, among the plurality of regions.

5. The memory device according to claim 4, wherein the control logic is configured to control the peripheral circuit to apply, as a width of the part of the pillar on which the selected word line is located becomes narrower, a higher pass voltage to the unselected word lines.

6. The memory device according to claim 1, wherein the plurality of memory cells are formed in a single-stack structure or in a multi-stack structure in which a plurality of stacks are piled up.

7. The memory device according to claim 6, wherein the control logic is configured to control the peripheral circuit to apply the second pass voltage different from the first pass voltage to at least one unselected word line which is adjacent to the selected memory cells, among the unselected word lines, depending on a width of a part of the pillar on which the selected word line, selected from each of the plurality of stacks included in the multi-stack structure, is located.

8. The memory device according to claim 1, wherein the control logic is configured to control the peripheral circuit to apply, during a read operation on the plurality of memory cells, the first pass voltage to the unselected word lines among the plurality of word lines regardless of the width of the part of the pillar on which the selected word line is located.

9. A method of verifying a memory cell string, wherein the memory cell string includes a plurality of memory cells stacked on a substrate, wherein the plurality of memory cells are electrically connected to a plurality of word lines and wherein the memory cell string includes a pillar penetrating through the plurality of word lines, comprising:

applying a verification voltage to a selected word line among a plurality of word lines electrically connected to the memory cell string, applying a first pass voltage to unselected word lines excluding at least one unselected word line adjacent to the selected word line, among the plurality of word lines, applying a second pass voltage different from the first pass voltage to the at least one unselected word line adjacent to the selected word line, depending on a width of a part of the pillar on which the selected word line is located.

10. The method according to claim 9, wherein the second pass voltage is higher than the first pass voltage.

11. A method of operating a memory device, comprising:

during a read operation, reading selected memory cells coupled to a selected word line by applying a read voltage to the selected word line and by applying a first pass voltage to unselected word lines; and during a verify operation, verifying the selected memory cells by selectively applying the first pass voltage and a second pass voltage higher than the first pass voltage to the unselected word lines depending on a width of the selected memory cells.

12. The method according to claim 11, wherein, during the verify operation:

when the width of the selected memory cells is larger than a reference width, the first pass voltage is applied to the unselected word lines; and when the width of the selected memory cells is smaller than the reference width, the first pass voltage and the second pass voltage are selectively applied to the unselected word lines.

13. The method according to claim 12, wherein, when the width of the selected memory cells is smaller than the reference width, the second pass voltage is applied to an unselected word line adjacent to the selected word line, among the unselected word lines, and the first pass voltage is applied to remaining unselected word lines.

* * * * *